United States Patent
Spinelli et al.

(10) Patent No.: US 7,130,321 B2
(45) Date of Patent: Oct. 31, 2006

(54) INTRACAVITY FREQUENCY-TRIPLED CW LASER WITH TRAVELING-WAVE RING-RESONATOR

(75) Inventors: Luis A. Spinelli, Sunnyvale, CA (US); Andrea Caprara, Menlo Park, CA (US)

(73) Assignee: Coherent, Inc., Santa Clara, CA (US)

( * ) Notice: Subject to any disclaimer, the term of this patent is extended or adjusted under 35 U.S.C. 154(b) by 288 days.

(21) Appl. No.: 10/826,835

(22) Filed: Apr. 16, 2004

(65) Prior Publication Data

US 2005/0163187 A1  Jul. 28, 2005

Related U.S. Application Data

(60) Provisional application No. 60/509,990, filed on Oct. 9, 2003.

(51) Int. Cl.
  *H01S 3/083* (2006.01)
  *H01S 3/10* (2006.01)
(52) U.S. Cl. ............... 372/22; 372/21; 372/23
(58) Field of Classification Search ............ 372/9, 372/21, 22, 23, 25, 92, 93, 94; 359/326, 359/328, 329
  See application file for complete search history.

(56) References Cited

U.S. PATENT DOCUMENTS

| | | | | |
|---|---|---|---|---|
| 4,194,168 A | * | 3/1980 | Jarrett et al. .................. 372/94 |
| 4,914,658 A | | 4/1990 | Stankov et al. ............... 372/18 |
| 5,068,546 A | * | 11/1991 | Hemmerich et al. ........ 359/328 |
| 5,121,402 A | * | 6/1992 | Scheps ........................ 372/70 |
| 5,206,868 A | * | 4/1993 | Deacon ........................ 372/21 |
| 5,278,852 A | | 1/1994 | Wu et al. ...................... 372/22 |
| 5,296,960 A | | 3/1994 | Ellingson et al. ........... 359/330 |
| 5,341,236 A | * | 8/1994 | Stappaerts ................... 359/328 |
| 5,390,211 A | | 2/1995 | Clark et al. .................... 372/95 |
| 5,610,759 A | | 3/1997 | Delacourt et al. .......... 359/328 |
| 5,640,405 A | * | 6/1997 | Wallace et al. ............... 372/21 |
| 5,768,302 A | * | 6/1998 | Wallace et al. ............... 372/21 |
| 5,832,013 A | * | 11/1998 | Yessik et al. ................. 372/26 |
| 5,850,407 A | * | 12/1998 | Grossman et al. ............ 372/22 |
| 5,898,717 A | * | 4/1999 | Yin .............................. 372/22 |
| 5,936,983 A | * | 8/1999 | Yusong et al. ................ 372/22 |
| 5,982,788 A | * | 11/1999 | Hemmati ...................... 372/21 |
| 6,002,695 A | * | 12/1999 | Alfrey et al. ................. 372/22 |
| 6,009,110 A | * | 12/1999 | Wiechmann et al. ......... 372/10 |
| 6,021,140 A | | 2/2000 | Clark et al. .................... 372/18 |

(Continued)

FOREIGN PATENT DOCUMENTS

WO    WO 91/05386    4/1991

(Continued)

*Primary Examiner*—Minsun O. Harvey
*Assistant Examiner*—Hrayr A. Sayadian
(74) *Attorney, Agent, or Firm*—Stallman & Pollock LLP

(57) ABSTRACT

A traveling-wave ring laser resonator includes one or more gain-elements for generating fundamental radiation and three optically nonlinear crystals. A portion of the fundamental radiation is converted to second-harmonic radiation in a first of the crystals. Remaining fundamental radiation and the second-harmonic radiation traverse a second of the optically nonlinear crystals where a portion of each is converted to third-harmonic radiation. Fundamental and second-harmonic radiation pass through the third of the optically nonlinear crystals where most of the second-harmonic radiation is converted back to fundamental radiation. The third-harmonic radiation can be delivered from the resonator as output radiation or mixed with the fundamental radiation in a fourth optically nonlinear crystal to generate fourth harmonic radiation. An optical parametric oscillator arrangement is also disclosed.

31 Claims, 19 Drawing Sheets

U.S. PATENT DOCUMENTS

| | | | | |
|---|---|---|---|---|
| 6,061,370 | A * | 5/2000 | Yin | 372/22 |
| 6,185,231 | B1 * | 2/2001 | Hammons et al. | 372/20 |
| 6,229,829 | B1 * | 5/2001 | Yin | 372/22 |
| 6,285,702 | B1 * | 9/2001 | Caprara et al. | 372/92 |
| 6,327,281 | B1 * | 12/2001 | Yin | 372/22 |
| 6,347,102 | B1 * | 2/2002 | Konno et al. | 372/22 |
| 6,366,596 | B1 * | 4/2002 | Yin et al. | 372/92 |
| 6,567,434 | B1 * | 5/2003 | Spinelli et al. | 372/22 |
| 6,570,904 | B1 * | 5/2003 | Cheng et al. | 372/93 |
| 6,584,134 | B1 * | 6/2003 | Yin et al. | 372/92 |
| 6,587,487 | B1 * | 7/2003 | Yin | 372/22 |
| 6,590,911 | B1 * | 7/2003 | Spinelli et al. | 372/22 |
| 6,614,818 | B1 * | 9/2003 | Kmetec et al. | 372/19 |
| 6,654,391 | B1 * | 11/2003 | Adams | 372/10 |
| 6,654,392 | B1 * | 11/2003 | Arbore et al. | 372/20 |
| 6,697,391 | B1 * | 2/2004 | Grossman et al. | 372/22 |
| 6,834,064 | B1 | 12/2004 | Paschotta et al. | 372/30 |
| 6,862,131 | B1 * | 3/2005 | Masuda | 359/326 |
| 6,873,639 | B1 * | 3/2005 | Zhang | 372/69 |
| 6,940,880 | B1 * | 9/2005 | Butterworth et al. | 372/22 |
| 6,961,355 | B1 * | 11/2005 | Yin et al. | 372/25 |
| 6,980,574 | B1 * | 12/2005 | Yin et al. | 372/26 |
| 6,999,483 | B1 * | 2/2006 | Yin | 372/22 |
| 7,012,696 | B1 * | 3/2006 | Orr et al. | 356/454 |
| 7,016,389 | B1 * | 3/2006 | Dudley et al. | 372/75 |
| 2001/0010697 | A1 * | 8/2001 | Hammons et al. | 372/20 |
| 2001/0010700 | A1 * | 8/2001 | Eichenholz et al. | 372/41 |
| 2002/0080841 | A1 * | 6/2002 | Yin et al. | 372/75 |
| 2002/0141457 | A1 * | 10/2002 | Adams | 372/10 |
| 2002/0191665 | A1 * | 12/2002 | Caprara et al. | 372/75 |
| 2002/0196819 | A1 | 12/2002 | Spinelli et al. | 372/21 |
| 2003/0035448 | A1 * | 2/2003 | Yin | 372/22 |
| 2003/0142703 | A1 * | 7/2003 | Gao et al. | 372/21 |
| 2003/0189711 | A1 * | 10/2003 | Orr et al. | 356/484 |
| 2003/0214984 | A1 * | 11/2003 | Grossman et al. | 372/22 |
| 2004/0086018 | A1 * | 5/2004 | Caprara et al. | 372/70 |
| 2004/0146076 | A1 * | 7/2004 | Dudley et al. | 372/22 |
| 2004/0179559 | A1 * | 9/2004 | Butterworth et al. | 372/21 |
| 2004/0218653 | A1 * | 11/2004 | Arbore et al. | 372/70 |
| 2004/0252734 | A1 * | 12/2004 | Karpushko | 372/22 |
| 2005/0078718 | A1 * | 4/2005 | Spinelli et al. | 372/22 |
| 2005/0163187 | A1 * | 7/2005 | Spinelli et al. | 372/94 |
| 2005/0220165 | A1 * | 10/2005 | Caprara et al. | 372/95 |
| 2005/0265421 | A1 * | 12/2005 | Butterworth et al. | 372/107 |

FOREIGN PATENT DOCUMENTS

WO    WO 01/93381 A1    12/2001

* cited by examiner

| Gain Medium | Wave-length (nm) | Crystal Temp. (°C) | Cut Angle φ | Cut Angle θ | Spot Size (μm) | Length (mm) | Doubling Efficiency α (W⁻¹) |
|---|---|---|---|---|---|---|---|
| Nd:YVO$_4$ | 1064 | 50 | 10.1 | 90.0 | 40 | 20 | 1.25 10⁻⁴ |
| Nd:YVO$_4$ | 1064 | 143 | 0.0 | 90.0 | 40 | 20 | 2.54 10⁻⁴ |
| OPS | 976 | 50 | 16.5 | 90.0 | 40 | 20 | 0.96 10⁻⁴ |
| OPS | 976 | 298 | 0.0 | 90.0 | 40 | 20 | 3.00 10⁻⁴ |

| Gain Medium | Wave-length (nm) | Inc. Angle $\gamma$ | Wedge Angle $\alpha$ | Cut Angle $\phi$ | Cut Angle $\theta$ | Spot Size ($\mu$m) | Length (mm) | Tripling Efficiency $\alpha$ (W$^{-1}$) |
|---|---|---|---|---|---|---|---|---|
| Nd:YVO$_4$ | 1064 | 27.7 | 17.3 | 90.0 | 43.0 | 40 | 20 | 3.79 10$^{-4}$ |
| OPS | 976 | 16.9 | 10.7 | 90.0 | 67.7 | 40 | 20 | 1.79 10$^{-4}$ |

| Gain Medium | Wave-length (nm) | Inc. Angle $\gamma$ | Wedge Angle $\alpha$ | Cut Angle $\phi$ | Cut Angle $\theta$ | Spot Size ($\mu$m) | Length (mm) | Tripling Efficiency $\alpha$ (W$^{-1}$) |
|---|---|---|---|---|---|---|---|---|
| Nd:YVO$_4$ | 1064 | 30.7 | 18.7 | 40.5 | 90.0 | 40 | 20 | 11.3 10$^{-4}$ |
| OPS | 976 | 24.6 | 15.1 | 58.0 | 90.0 | 40 | 20 | 12.6 10$^{-4}$ |

| Gain Medium | Wave-length (nm) | Cut Angle φ | Cut Angle θ | Spot Size (μm) | Length (mm) | Tripling Efficiency α (W⁻¹) |
|---|---|---|---|---|---|---|
| Nd:YVO$_4$ | 1064 | 90.0 | 180.0 - 31.3 = 148.7 | 40 | 20 | 5.94 10$^{-4}$ |
| OPS | 976 | 90.0 | 180.0 - 34.4 = 145.6 | 40 | 20 | 6.41 10$^{-4}$ |

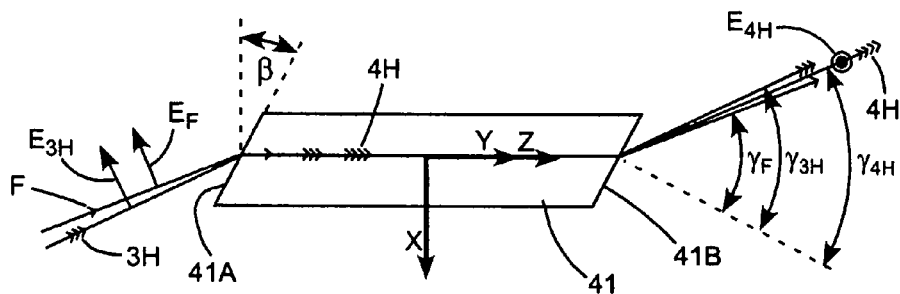
FIG. 13A
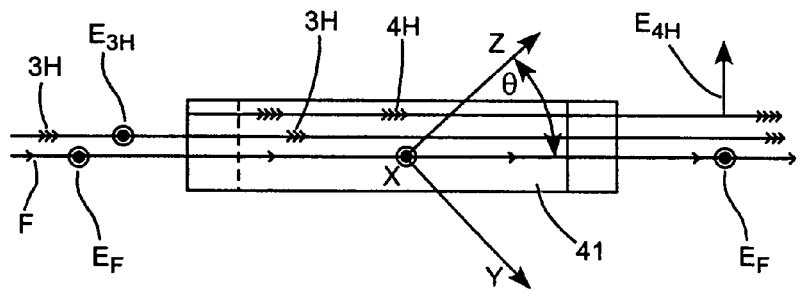
FIG. 13B
| Gain Medium | Wave-length (nm) | Inc. Angle $\gamma_F$ | Inc. Angle $\gamma_{3H}$ | Inc. Angle $\gamma_{4H}$ | Wedge Angle $\beta$ | Cut Angle $\phi$ | Cut Angle $\theta$ | Spot Size ($\mu$m) | Length (mm) | Quadrupling Efficiency $\alpha$ (W$^{-1}$) |
|---|---|---|---|---|---|---|---|---|---|---|
| Nd:YVO$_4$ | 1064 | 58.85 | 61.91 | 61.12 | 31.15 | 90.0 | 180 − 40.30 = 139.70 | 40 | 20 | 2.97 10$^{-4}$ |
| OPS | 976 | 58.87 | 62.58 | 61.61 | 31.12 | 90.0 | 180 − 45.43 = 134.57 | 40 | 20 | 2.80 10$^{-4}$ |
FIG. 14

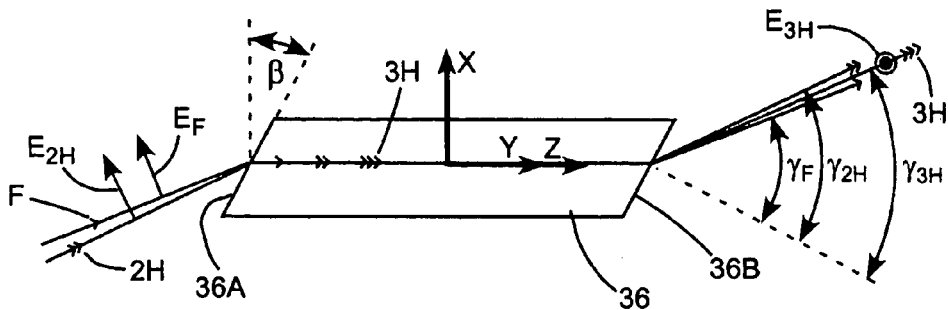
FIG. 15A
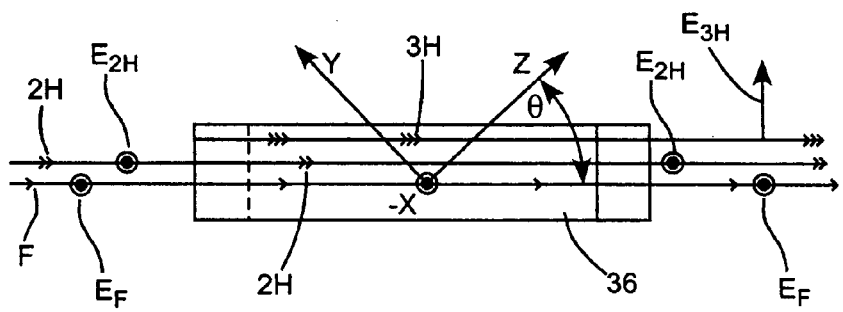
FIG. 15B
| Gain Medium | Wave-length (nm) | Inc. Angle $\gamma_F$ | Inc. Angle $\gamma_{3H}$ | Inc. Angle $\gamma_{4H}$ | Wedge Angle $\beta$ | Cut Angle $\phi$ | Cut Angle $\theta$ | Spot Size (μm) | Length (mm) | Tripling Efficiency $\alpha$ (W⁻¹) |
|---|---|---|---|---|---|---|---|---|---|---|
| Nd:YVO$_4$ | 1064 | 58.8 | 60.0 | 59.6 | 31.20 | -90.0 | 180 - 31.3 = 148.7 | 40 | 20 | 2.80 10⁻⁴ |
FIG. 16

INTRACAVITY FREQUENCY-TRIPLED CW LASER WITH TRAVELING-WAVE RING-RESONATOR

PRIORITY CLAIM

The present application claims priority to U.S. Provisional Patent Application Ser. No. 60/509,990, filed Oct. 9, 2003, the disclosure of which is incorporated in this document by reference.

TECHNICAL FIELD OF THE INVENTION

The present invention relates generally to harmonic generation in lasers. The invention relates in particular to intracavity generation of third and higher harmonics in a continuous wave (CW) laser.

DISCUSSION OF BACKGROUND ART

Prior art arrangements for intracavity third-harmonic generation in CW lasers result in relatively inefficient conversion of fundamental radiation to the third harmonic. By way of example, ultraviolet (UV) radiation having a wavelength of 355 nanometers (nm) can be generated by frequency doubling fundamental 1064 nm (infrared) radiation in a first optically nonlinear crystal to provide second-harmonic radiation having a wavelength of 532 nm (green radiation), then focusing the 532 nm radiation and the fundamental radiation into a second optically nonlinear crystal to generate the 355 nm radiation. The generated UV power can be estimated, for appropriate focusing of the beams and appropriate choice of propagation direction into the crystal, by an equation:

$$P_{355} = \alpha P_{1064} P_{532} \qquad (1)$$

Where $\alpha$ has dimensions of Watts$\times 10^{-1}$ and has dimensions for typical crystals of between about $10^{-5}$ and $10^{-3}$ and where $P_{355}$, $P_{1064}$, and $P_{532}$ are the powers for the UV, infrared (IR) and green radiations respectively. In a Coherent® Verdi™V10™, intracavity frequency-doubled, diode-pumped, Nd:YVO$_4$ laser, about 350 Watts (W) of IR radiation having a wavelength of about 1064 nm are circulating in a ring-resonator, and about 10 W of green (532 nm) radiation are generated by frequency-doubling the IR radiation in an optically nonlinear crystal of lithium borate (LBO). If a second optically nonlinear crystal of LBO having a length of 20.0 millimeters (mm) were included in the ring-resonator and the IR and green radiation were focused into that crystal, a value of $\alpha$ of $3\times 10^{-4}$ can be achieved and equation (1) predicts that about 1 W of ultraviolet radiation at 355 nm would be generated. This represents a conversion efficiency of pump-power to third harmonic of only about 2.5%. There is a need for an improvement in efficiency for third-harmonic generation in a CW laser.

SUMMARY OF THE INVENTION

In a laser in accordance with the present invention efficiency of third harmonic conversion in an intracavity frequency tripled CW traveling wave laser is increased by converting second-harmonic radiation that is not converted to third-harmonic radiation back into fundamental radiation and using that fundamental radiation for further harmonic conversion. This improves the third harmonic generating efficiency by a factor of about two or greater.

One aspect the inventive laser comprises a traveling-wave ring laser resonator having first, second, and third optically nonlinear crystals therein. The resonator includes at least one gain-element for generating fundamental radiation therein. The fundamental radiation circulates through the first, second and third optically nonlinear crystals in the sequence listed. The first optically nonlinear crystal is arranged to convert a portion of the fundamental radiation to second-harmonic radiation. The second optically nonlinear crystal is arranged to convert a portion of the second-harmonic radiation from the first optically nonlinear crystal into radiation having a frequency different from that of the second-harmonic radiation. The third optically nonlinear crystal is arranged to convert at least a portion of any remaining portion of the second-harmonic radiation back to fundamental radiation.

The fundamental radiation from the re-conversion process is re-circulated in the resonator and added to newly generated fundamental radiation. This improves the efficiency of generating the second-harmonic radiation and increases the amount of second-harmonic radiation available for conversion to radiation of other wavelengths. The converted-frequency radiation from second optically nonlinear crystal may be a third-harmonic frequency resulting from mixing fundamental radiation with the second-harmonic radiation. The converted-frequency radiation from second optically nonlinear crystal may also have a non-integer relationship with the second harmonic radiation as a result of parametric decomposition of the second-harmonic radiation in the second optically nonlinear crystal.

In one preferred embodiment of the inventive laser back conversation of second-harmonic radiation is optimized when there is a particular phase relationship between said fundamental and second-harmonic radiations on entering the third optically nonlinear crystal. An optical path difference is introduced between the fundamental and third-harmonic radiations before the radiations enter the third optically nonlinear crystal. This path difference causes the phase relationship between the fundamental and second-harmonic radiations entering the third optically nonlinear crystal to vary periodically with frequency of the fundamental radiation. The periodic variation is such that there is at least one possible fundamental radiation frequency of the laser resonator for which said particular (optimum) phase relationship at the third nonlinear crystal exists.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

FIG. 13A is an elevation view schematically illustrating details of cut angles and electric-field orientations in one example of an optically nonlinear crystal of CBO arranged for fourth-harmonic generation in the frequency-multiplying method of the present invention.

FIG. 13B is a plan view from below schematically illustrating further details of the BBO crystal of FIG. 13A.

FIG. 14 is a table providing exemplary parameters of the crystal of FIGS. 13A and 13B for two different fundamental-radiation wavelengths.

FIG. 15A is an elevation view schematically illustrating details of cut angles and electric-field orientations in another example of an optically nonlinear crystal of BBO arranged for third-harmonic generation in the frequency-multiplying method of the present invention.

FIG. 15B is a plan view from below schematically illustrating further details of the BBO crystal of FIG. 15A.

FIG. 16 is a table providing exemplary parameters of the crystal of FIGS. 15A and 15B for a fundamental wavelength of 1064 nm.

DETAILED DESCRIPTION OF THE INVENTION

Figure 1:
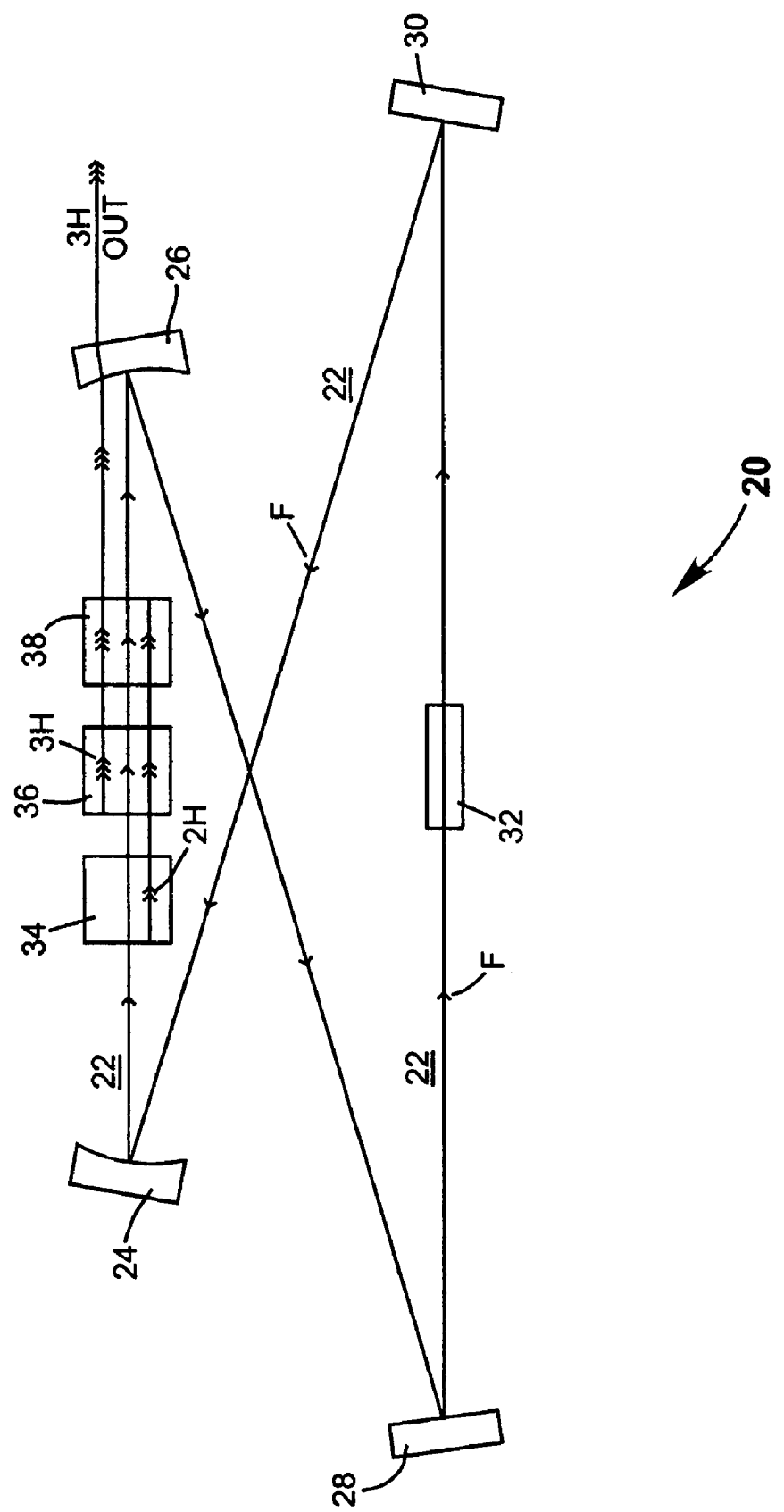
FIG. 1 schematically illustrates a preferred embodiment of an intracavity frequency-tripled, CW laser in accordance with the present invention, including a ring-resonator formed by two concave mirrors and two plane mirrors, the resonator including a gain-medium located between the plane mirrors and three optically nonlinear crystals located between the two concave mirrors.

Referring now to the drawings, wherein like components are designated by like reference numerals, FIG. 1 schematically illustrates a preferred embodiment 20 of an intracavity-tripled, CW laser in accordance with the present invention. Laser 20 includes a ring-resonator (traveling-wave resonator) 22 formed between concave mirrors 24 and 26 and plane mirrors 28 and 30. In practice it may be found advantageous to configure mirrors 28 and 30 as shallow concave mirrors. Resonator 22 includes a solid-state gain-medium 32. It is assumed for the purposes of this description that gain-medium 32 is neodymium orthovanadate (Nd:YVO$_4$) providing fundamental (IR) radiation having a wavelength of about 1064 nm when optically pumped. Fundamental radiation circulates in the resonator around a resonator axis, in one direction only, as indicated by single arrows F. Arrangements for optically pumping such a gain-medium and light-valve arrangements for causing radiation to circulate in one direction only are well known in the art and are not necessary for understanding principles of the present invention. Accordingly, such arrangements are not depicted in FIG. 1 for simplicity of illustration, and are not described in detail herein.

The radius of curvature and separation of concave mirrors 24 and 26 is preferably selected such that the circulating fundamental radiation is focused to a narrow beam-waist (not explicitly shown) at a position about midway between the mirrors. Located about the beam-waist position are optically nonlinear crystals 34, 36, and 38 arranged such that the circulating fundamental radiation traverses the crystals in turn. One preferred material for these optically nonlinear crystals is lithium borate (LBO), but this should not be construed as limiting the present invention.

A fraction of the fundamental radiation traversing crystal 34 is converted to second-harmonic (2H or green) radiation as indicated by double arrow 2H. By way of example, between about 3% and 10% of the fundamental radiation may be converted to second-harmonic radiation. The wavelength of the second-harmonic radiation is about 532 nm. Optically nonlinear crystal 36 is arranged such that some fraction of the 2H-radiation and some fraction of fundamental radiation traversing the crystal are sum-frequency mixed to provide third-harmonic (3H or ultraviolet) radiation as indicated by triple arrows 3H. The 3H-radiation can be directed out resonator 22, for example, through mirror 26 or by a separate dichroic mirror (not shown). It should be noted here that the paths of fundamental, 2H and 3H-radiations are shown as being widely separate in FIG. 1 merely for convenience of illustration. In practice the paths are either collinear or very narrowly diverging.

Optically nonlinear crystal 38 is arranged with respect to crystal 36 such that 2H-radiation entering crystal 38, together with fundamental radiation, has a phase relationship with the fundamental radiation that causes the 2H-radiation to be converted back to fundamental radiation. The phase relationship and the back conversion mechanism are described briefly as follows.

In conventional second-harmonic generation in an optically nonlinear crystal, the generated 2H-radiation lags in phase by 90° the nonlinear polarization induced by the fundamental radiation. If 2H-radiation is presented at the input of an optically nonlinear crystal together with fundamental radiation, and if the 2H-radiation leads (rather than lags) in phase by 90° the nonlinear polarization induced by the fundamental, then the 2H-radiation generated in the crystal from the fundamental is in opposition of phase with respect to the 2H-radiation entering the crystal. Because of this, cancellation of the input 2H-radiation field takes place with concurrent transfer of the 2H-energy to the fundamental field.

One possible means of achieving the required phase relationship is to use optically nonlinear crystal 36 as a variable phase-retarder. Third-harmonic generation in the crystal is optimum at a particular phase-matching angle that is different for different temperatures of the crystal. Accordingly, there is an infinitely variable range of pairs of temperature and phase-matching angles that will provide optimum third-harmonic generation. The phase relationship of unconverted fundamental and 2H-radiation leaving the crystal will be different for different pairs of temperature and phase-matching angle. Crystal 36 can be located in a temperature controlled oven (not shown) and the temperature and phase-matching angle varied until third-harmonic generation in optically nonlinear crystal 36 and back conversion of 2H-radiation to fundamental radiation in optically nonlinear crystal 38 are optimized. By way of example, in a BBO crystal having a length of about 15.0 mm the phase relationship between fundamental and 2H radiation exiting the crystal varies by about $\pi/20$ radians per degree Celsius (° C.).

Back-conversion of 2H-radiation in crystal 38 considerably reduces overall losses in resonator 22 seen by the fundamental radiation. This allows circulating fundamental radiation to grow to substantially higher intensity levels than are possible in the absence of back conversion. The higher fundamental-radiation intensity provides that a higher 2H-radiation intensity is generated by optically nonlinear crystal 34. The higher fundamental and 2H-radiation intensities in optically nonlinear crystal 36 provide for higher third-harmonic-radiation intensity than in prior-art lasers in which second-harmonic back-conversion does not occur. Power is coupled out of resonator 22 essentially only as 3H-radiation. The term "essentially", here, meaning that unavoidable parasitic linear losses in the resonator are discounted. Numerical simulations predict that as much as about 10.0 W or more of UV (3H) radiation can be generated in a Nd:YVO$_4$ ring-laser wherein the gain-medium is diode-pumped with about 60.0 Watts of 808 nm pump radiation.

Figure 2:
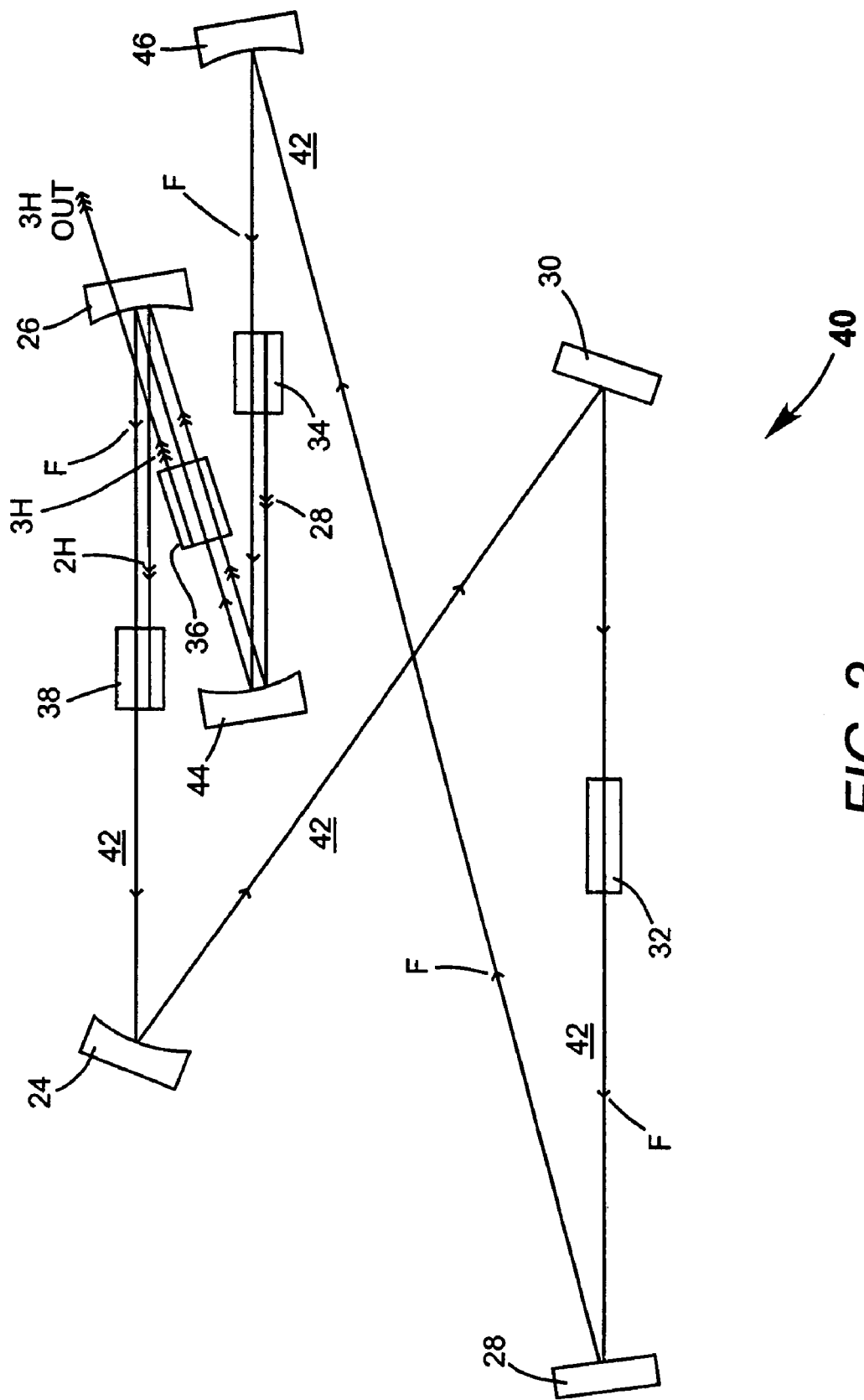
FIG. 2 schematically illustrates another preferred embodiment of an intracavity frequency-tripled, CW laser in accordance with the present invention, including a ring-resonator formed by four concave mirrors and two plane mirrors, the resonator including a gain-medium located between the plane mirrors and three optically nonlinear crystals, each thereof separately located between a pair of the four concave mirrors.

A shortcoming of laser 20 is that not all of the optically nonlinear crystals 34, 36, and 38 can be optimally positioned at the fundamental beam-waist between mirrors 24 and 26 because of the length and spacing of the crystals relative to the Rayleigh range of the beam-waist. FIG. 2 schematically depicts another embodiment 40 of a laser in accordance with the present invention that remedies this shortcoming by forming a ring-resonator 42 having a separate beam-waist for each of the optically nonlinear crystals. Here again, optical pumping and light valve arrangements are omitted from the drawing for convenience of illustration.

Resonator 42 includes plane mirrors 28 and 30 and concave mirrors 24 and 26 of above discussed resonator 22, and further includes concave mirrors 44 and 46. Fundamental radiation circulates in one direction only as indicated by single arrows F. Radii of curvature and spacing of the concave mirrors is selected such that optically nonlinear crystal 34 can be placed at a fundamental beam-waist between mirrors 44 and 46; optically nonlinear crystal 36 can be placed at a fundamental beam-waist between mirrors 44 and 26; and optically nonlinear crystal 38 can be placed at a fundamental beam-waist between mirrors 24 and 26. Gain-medium 32 is between mirrors 28 and 30. The sequence of harmonic conversion is as described above for laser 20. Fundamental radiation is converted to 2H-radiation in optically nonlinear crystal 34; fundamental radiation and 2H-radiations are converted to 3H-radiation in optically nonlinear crystal 36, and 2H-radiation is converted back to fundamental radiation in optically nonlinear crystal 38.

Figure 3:
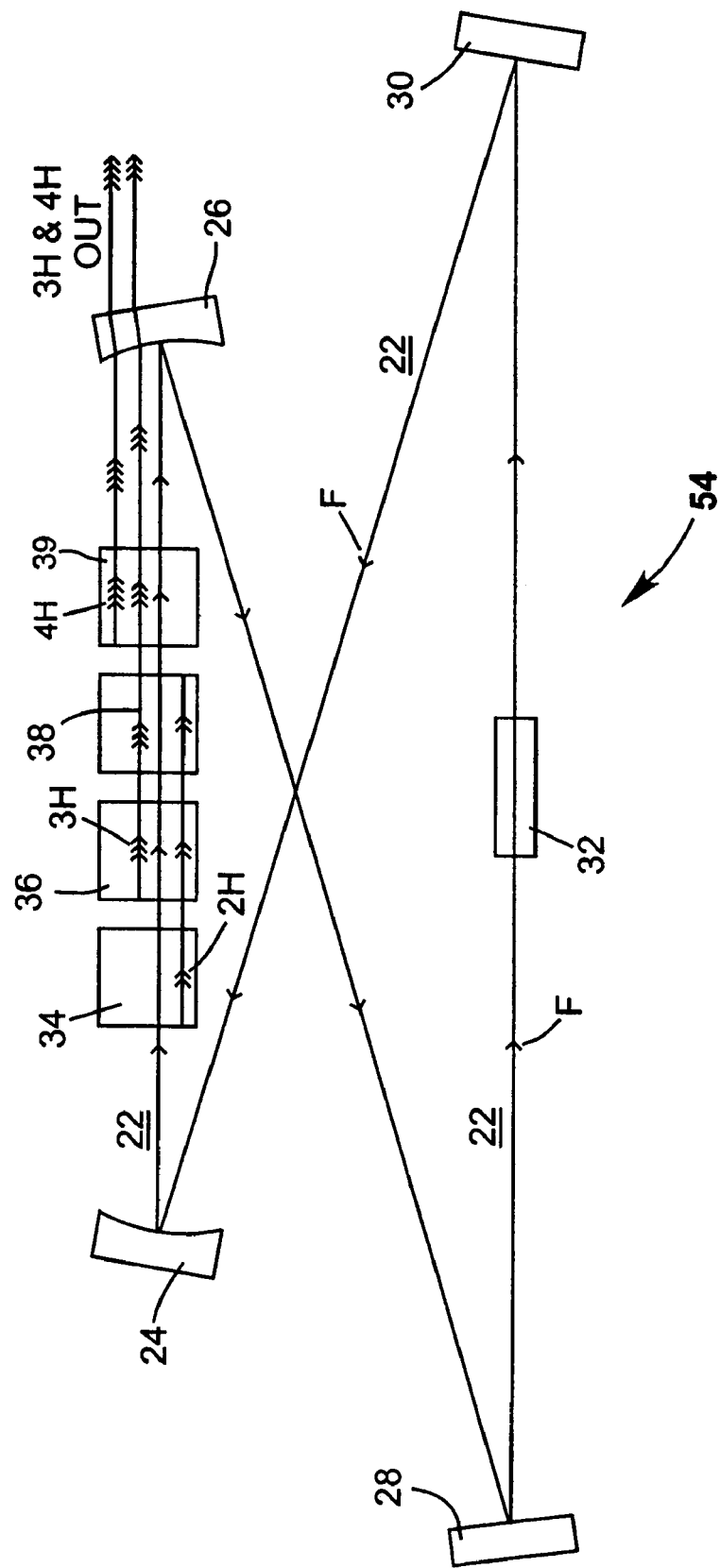
FIG. 3 schematically illustrates a preferred embodiment of an intracavity frequency-quadrupled, CW laser in accordance with the present invention, including a ring-resonator formed by two concave mirrors and two plane mirrors, the resonator including a gain-medium located between the plane mirrors and four optically nonlinear crystals located between the two concave mirrors.

The intracavity frequency-conversion method of the present invention can be extended to include at least one additional stage of frequency conversion. By way of example third-harmonic radiation generated as discussed above can be mixed in a fourth optically nonlinear crystal to generate fourth-harmonic radiation. FIG. 3 schematically illustrates a laser 54 in accordance with the present invention arranged to generate fourth-harmonic radiation (4H-radiation) by the inventive method.

Laser 54 is similar to laser 20 of FIG. 1, inasmuch as it includes a ring-resonator 22 formed by concave mirrors 24 and 26 and plane mirrors 28 and 30. Gain-medium 32 is located between the plane mirrors. Located between the two concave mirrors are optically linear crystals 34, 36, and 38, arranged to generate 3H-radiation by the inventive method, with optically nonlinear crystal 38 arranged to reconvert residual 2H-radiation back to fundamental radiation F. Additionally, a fourth optically nonlinear crystal 39 is located between concave mirrors 24 and 26. Optically nonlinear crystal 39 is arranged to generate 4H-radiation by sum-frequency mixing fundamental and 3-H radiations exiting optically nonlinear crystal 38. A crystal of β-barium borate (BBO) is preferred for converting 355 nm-radiation and 1064 nm-radiation to 4H-radiation having a wavelength of 266 nm.

The 4H-radiation and residual (unconverted) 3H-radiation are directed out of resonator 22 and can be separated by any well-known means. Here of course the residual 3H-radiation represents a loss in the conversion process. Nevertheless, the improved efficiency of generating the 3H-radiation and the higher circulating fundamental power from the 2H-reconversion makes 4H-generation more efficient than would be the case in prior-art methods that do not include reconverting 2H-radiation to fundamental radiation.

The inventive frequency-tripling method is described embodied in solid-state lasers including a traveling-wave ring-resonator. A ring-resonator is advantageous in solid-state lasers as it eliminates spatial hole burning in the gain-medium and allows operation in single longitudinal mode. Single longitudinal mode operation is preferred in harmonic generation as it minimizes beam amplitude noise. It is important that all resonator mirrors directing fundamental radiation be coated for maximum reflectivity (for example greater than about 99% reflectivity) at the wavelength of fundamental radiation, so that fundamental radiation is trapped inside the resonator. In this way, fundamental-radiation intensity in the resonator is maximized. Any delivery of fundamental radiation from a resonator between the third harmonic generating crystal and the crystal used to convert 2H-radiation back to fundamental radiation will reduce the circulating fundamental-radiation intensity and could cause the resonator to act in a passively-modelocked, pulsed manner, thereby defeating an object of the present invention to deliver only CW radiation.

Embodiments of lasers in accordance with the present invention are not restricted to use with solid-state gain media such as Nd:YVO$_4$, but may also be configured to include an optically pumped semiconductor OPS lasers. An OPS-laser includes an OPS-structure comprising a mirror-structure surmounted by a multilayer gain structure. The OPS-structure is usually supported, mirror-structure side down, on a thermally-conductive substrate or an active heat-sink. The multilayer gain-structure includes a plurality of very thin (usually less than 200 nm) active or quantum-well (QW) layers spaced apart (by one-half wavelength of the fundamental wavelength) by pump-light-absorbing spacer layers. An OPS laser is usually pumped by pump-light directed through the front of the gain-structure.

Figure 4:
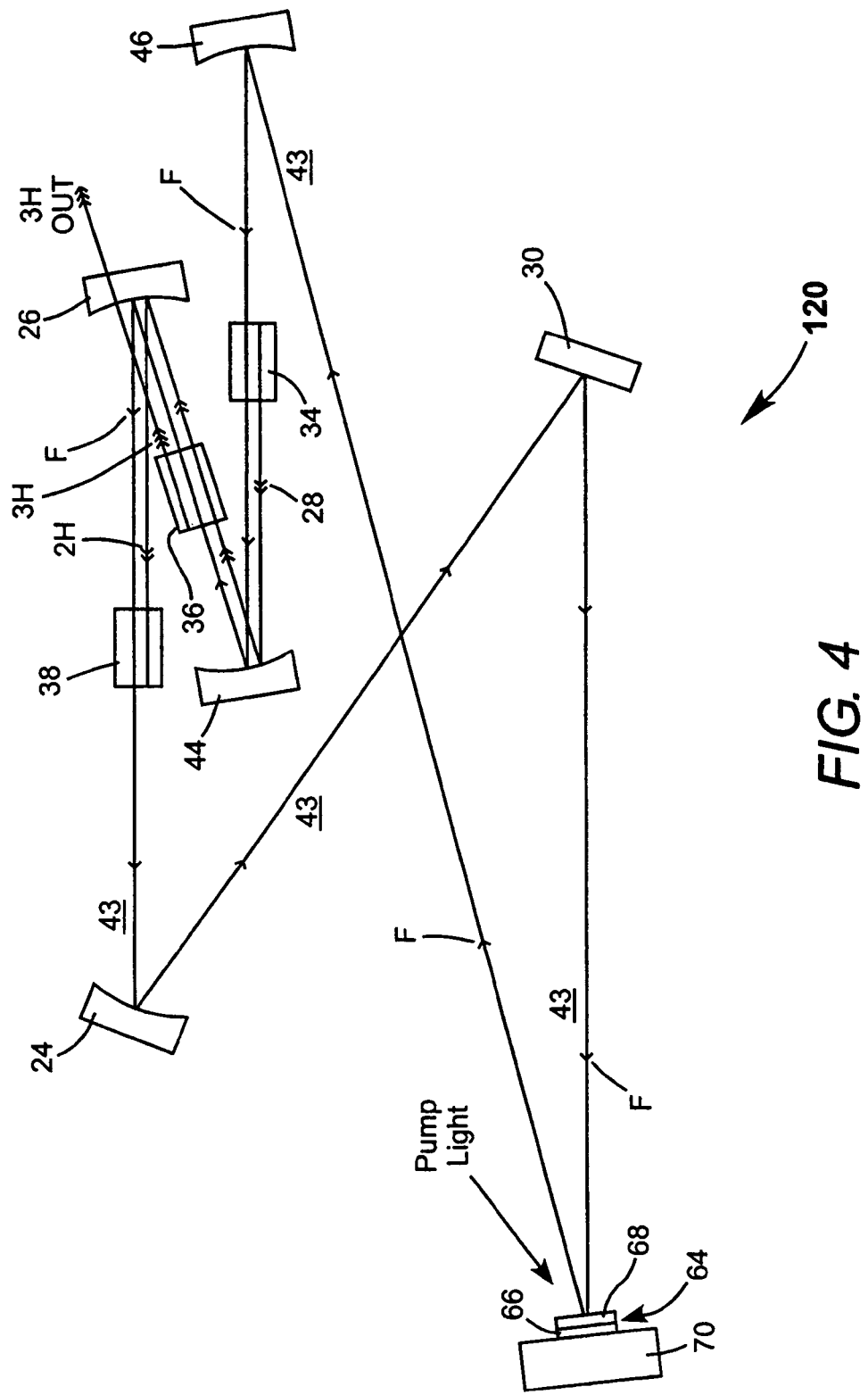
FIG. 4 schematically illustrates a further preferred embodiment of an intracavity frequency-tripled, CW laser in accordance with the present invention, including a ring-resonator formed by four concave mirrors, a plane mirror, and the mirror-structure of an OPS-structure, the resonator including a gain-structure of the OPS-structure, and three optically nonlinear crystals, each thereof separately located between a pair of the four concave mirrors.

FIG. 4 schematically illustrates one embodiment 120 of a traveling-wave ring-laser in accordance with the present invention. Laser 120 includes a traveling-wave laser resonator 43 similar to resonator 42 of laser 40 of FIG. 2, with an exception that solid-state gain-medium 32 of laser 40 is replaced by gain-structure 68 of an OPS-structure 64, and mirror-structure 66 of the OPS-structure replaces plane mirror 28 of laser 40. OPS-structure is energized by pump light directed through the front of gain-structure 68. Resonator 40 includes optically nonlinear crystals 34, 36, and 38, each thereof located at a beam-waist position between a pair of resonator mirrors. 2H-radiation is generated in optically nonlinear crystal 34. 2H-radiation and fundamental radiation are mixed in optically nonlinear crystal 36 to generate 3H-radiation. Residual 2H-radiation is converted back to fundamental radiation in optically nonlinear crystal 38.

A description of optically nonlinear crystal design and conversion efficiency estimates for the frequency conversion method of the present invention is next set forth. For efficiency estimates, power generated in second-harmonic generation (SHG) can be approximated by an equation:

$$P_{2H} = \alpha_{SHG} P_F^2 \qquad (2)$$

where $P_{2H}$ is the second harmonic power, $P_F^2$ is the fundamental power squared, and $\alpha_{SHG}$ is a conversion coefficient, having a dimension of inverse Watts (W$^{-1}$) as discussed above. The power generated in third-harmonic generation (THG) can be approximated by an equation:

$$P_{3H} = \alpha_{THG} P_F P_{2H} \qquad (3)$$

where $P_{3H}$ is the third harmonic power. The conversion coefficient $\alpha_{THG}$ can be computed for the specified beam sizes, and for different optically nonlinear crystal materials and lengths, using Boyd-Kleinman computations.

Figures 5, 6:
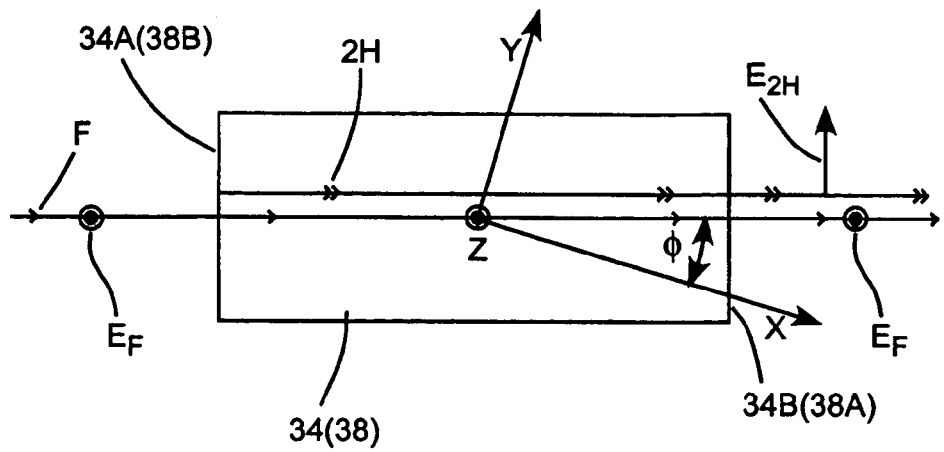
FIG. 5 schematically illustrates details of cut angles and electric-field orientations in one example of an optically nonlinear crystal of LBO arranged for second-harmonic generation and back-conversion in the frequency-multiplying method of the present invention.
FIG. 6 is a table providing exemplary parameters of the crystal of FIG. 5 for two different fundamental-radiation wavelengths and two different crystal temperatures for each fundamental wavelength.

In any of the above described embodiments of lasers in accordance with the present invention including a solid state gain-medium of Nd:YVO4 providing fundamental radiation having a wavelength of 1064 nm, or including an OPS-gain structure providing fundamental radiation F at a wavelength of 976 nm, an optically nonlinear crystal of LBO is preferred for second-harmonic generation and back-conversion, i.e., for optically nonlinear crystal 34. Details of cut angles and electric-field orientations in one example of an optically nonlinear crystal 34 of LBO arranged for second-harmonic generation and back-conversion (38) are schematically depicted in FIG. 5. Cut angles include an angle θ, which is the angle of the crystalline Z axis with the longitudinal axis of the crystal, and is not specifically designated in FIG. 5, and an angle φ, which is the angle of the crystalline X axis with the longitudinal axis of the crystal. Crystal entrance and exit faces 34A (38B) and 34B (38A) of crystal 34 (38) respectively are, here, perpendicular to the longitudinal axis and to incident fundamental radiation F. The electric field (polarization) of the fundamental radiation (single arrows) is perpendicular to the plane of the drawing as indicated by arrowhead $E_F$. The electric field (polarization) of the 2H-radiation (double arrows) is in the plane of the drawing, perpendicular to the polarization plane of the fundamental radiation as indicated by $E_{2H}$. In FIG. 6, a table provides examples of values of crystal temperature, cut angles, fundamental beam size in the crystal, and computed second-harmonic generating (doubling) efficiency for a crystal having a length of twenty millimeters (20.0 mm), and for fundamental wavelengths of 1064 nm and 976 nm.

Figures 7, 8:
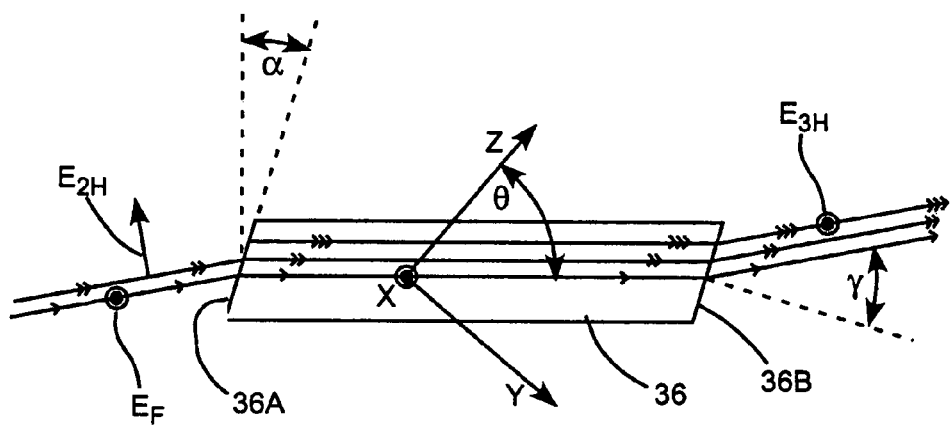
FIG. 7 schematically illustrates details of cut angles and electric-field orientations in one example of an optically nonlinear crystal of LBO arranged for third-harmonic generation in the frequency-multiplying method of the present invention.
FIG. 8 is a table providing exemplary parameters of the crystal of FIG. 7 for two different fundamental-radiation wavelengths.

Preferred optically nonlinear crystals for third-harmonic generation in any of the above described embodiments of lasers in accordance with the present invention wherein fundamental radiation has a wavelength of 1064 nm or 976 nm include LBO cesium borate (CBO) and BBO. Details of cut angles and electric-field orientations in one example of an optically nonlinear crystal 36 of LBO arranged for third-harmonic generation are schematically depicted in FIG. 7. Cut angles include an angles θ and φ, are as defined above with reference to FIG. 5. Crystal entrance and exit faces 36A and 36B respectively are parallel to each other, here, at a wedge angle α to the longitudinal axis. Fundamental radiation F and second-harmonic radiation 2H are incident on face 36A at an angle such that the radiations travel parallel to the longitudinal axis of the crystal and exit face 36A at the same angle (the incidence angle) γ. The electric field (polarization) of the fundamental radiation (single arrows) is perpendicular to the plane of the drawing as indicated by arrowhead $E_F$. The electric field (polarization) of the 2H-radiation (double arrows) is perpendicular to the polarization plane of the fundamental radiation as indicated by $E_{2H}$. The polarization of 3H-radiation (triple arrows) is perpendicular to the polarization of 2H-radiation. In FIG. 8, a table provides examples of values of cut angles, wedge and incidence angles, fundamental beam size in the crystal, and computed third-harmonic generating (tripling) efficiency for a LBO crystal having a length of twenty millimeters, at fundamental wavelengths of 1064 nm and 976 nm.

Figures 9, 10:
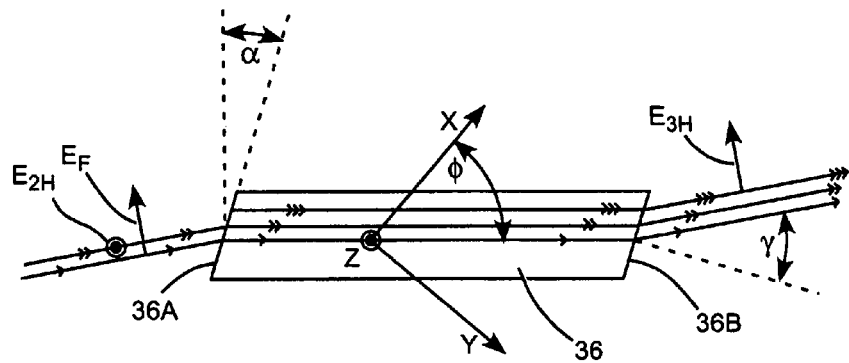
FIG. 9 schematically illustrates details of cut angles and electric-field orientations in one example of an optically nonlinear crystal of CBO arranged for third-harmonic generation in the frequency-multiplying method of the present invention.
FIG. 10 is table providing exemplary parameters of the crystal of FIG. 9.

Details of cut angles and electric-field orientations in one example of an optically nonlinear crystal 36 of CBO arranged for third-harmonic generation are schematically depicted in FIG. 9. Here again, for consistency of numbering with third-harmonic-generating crystals in above-described inventive lasers, the crystal is still designated by numeral 36, even though it is differently cut and is of a different material from the crystal of FIG. 7. The crystal has parallel faces 36A and 36B at the wedge angle α to the longitudinal axis of the crystal. The electric field (polarization) of the fundamental radiation is in the plane of the drawing as indicated by arrow $E_F$. The electric field (polarization) of the 2H-radiation is perpendicular to the polarization of the fundamental radiation as indicated by arrowhead $E_{2H}$. The polarization of 3H-radiation (triple arrows) is perpendicular to the plane of 2H-radiation. In FIG. 10, a table provides examples of values of cut angles, wedge and incidence angles, fundamental beam size in the crystal, and computed third-harmonic generating (tripling) efficiency for a CBO crystal having a length of twenty millimeters, at a fundamental wavelength 976 nm and 1064 nm.

Figures 11, 12:
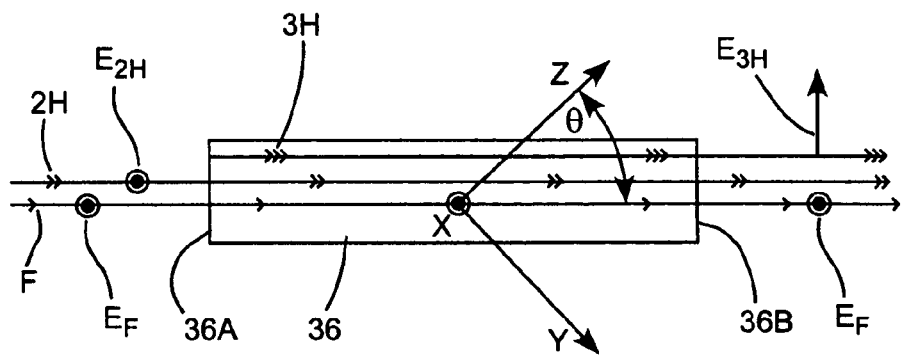
FIG. 11 schematically illustrates details of cut angles and electric-field orientations in one example of an optically nonlinear crystal of BBO arranged for third-harmonic generation in the frequency-multiplying method of the present invention.
FIG. 12 is a table providing exemplary parameters of the crystal of FIG. 11 for two different fundamental-radiation wavelengths.

FIG. 11 schematically depicts details of cut angles and electric-field orientations in one example of an optically nonlinear crystal 36 of BBO arranged for third-harmonic generation. Here for consistency of numbering with third-harmonic generating crystals in above described inventive lasers, the crystal is still designated by numeral 36, even though it is differently cut and is of a different material from the crystal of FIG. 7. Exit and entrance faces 36A and 36B, respectively, are perpendicular to the longitudinal axis of the crystal. Fundamental and 2H-radiations are normally incident on the exit and entrance faces. The polarizations of the fundamental radiation and 2H-radiation are perpendicular to the plane of the drawing as indicated by arrowheads $E_F$ and $E_{2H}$. The polarization of 3H-radiation is perpendicular to the polarizations of 2H-radiation and fundamental radiation. In FIG. 12, a table provides examples of values of cut angles, fundamental beam size in the crystal, and computed third-harmonic generating (tripling) efficiency for a BBO crystal having a length of twenty millimeters, at fundamental wavelengths of 1064 nm and 976 nm.

FIG. 13A and FIG. 13B schematically depict details of cut angles and electric-field orientations in one example of an optically nonlinear crystal 41 of BBO arranged for fourth-harmonic generation. Here, fundamental and 3H-harmonic radiations are incident on entrance face 41A of the crystal at an angle to each other and at incidence angles $\gamma_F$ and $\gamma_{3H}$ selected such both the fundamental and 3H-radiations traverse crystal 41 parallel to the longitudinal axis of the crystal. As entrance face 41A and exit face 41B are parallel to each other, the fundamental and 3H-radiations leave exit face 41B of crystal 41 at the same respective (external) incidence angles, and with the same angular separation. Generated 4H-radiation (quadruple arrows) leaves exit face 41B of crystal 41 at an incidence angle γ4H between $\gamma_F$ and $\gamma_{3H}$. The fundamental and 3H-radiations enter the crystal with polarizations parallel to each other. Generated 4H-radiation is polarized perpendicular to the polarization of the fundamental and 3H-radiations. In FIG. 14, a table provides examples of values of cut angles, incidence angles $\gamma_F$, $\gamma_{3H}$, and $\gamma_{4H}$, fundamental beam size in the crystal, and computed fourth-harmonic generating (quadrupling) efficiency for a BBO crystal having a length of twenty millimeters, at fundamental wavelengths of 1064 nm and 976 nm.

FIG. 15A and FIG. 15B schematically depict details of cut angles and electric-field orientations in one example of an optically nonlinear crystal 36 of BBO arranged for third-harmonic generation. Here, fundamental and 2H-radiations are incident on entrance face 36A of the crystal at an angle to each other and at incidence angles $\gamma_F$ and $\gamma_{2H}$ selected such both the fundamental and 2H-radiations traverse crystal 36 parallel to the longitudinal axis of the crystal. As entrance face 36A and exit face 36B are parallel to each other, the fundamental and 2H-radiations leave exit face 36B of crystal 36 at the same respective (external) incidence angles, and with the same angular separation. Generated 3H-radiation (triple arrows) leaves exit face 36B of crystal 36 at an incidence angle $\gamma_{3H}$ between $\gamma_F$ and $\gamma_{2H}$. The fundamental and 2H-radiations enter and exit the crystal with polarizations parallel to each other. Generated 3H-radiation is polarized perpendicular to the polarization of the fundamental and 2H-radiations. In FIG. 16, a table provides examples of values of cut angles, incidence angles $\gamma_F$, $\gamma_{2H}$, and $\gamma_{3H}$, fundamental beam size in the crystal, and computed third-harmonic generating (tripling) efficiency for a BBO crystal having a length of twenty millimeters, at a fundamental wavelengths of 1064 nm.

Having estimated the conversion efficiency of various optically nonlinear crystal materials and crystal configurations, the harmonic power generated for above described embodiments of the inventive lasers can be computed. TABLE 1 lists calculated 3H-radiation power generated in a Nd:YVO$_4$ laser in accordance with above-described laser 40 of FIG. 2. It is assumed here that the second-harmonic generation and reconversion crystals 34 and 38, respectively, are LBO crystals cut as depicted in FIG. 5.

TABLE 1

| Pump Power (Watts @ 810 nm) | Spot Size in Nd:YVO$_4$ μm | THG Crystal Material (20 mm) | Circulating Fundamental Power (Watts) | Generated 2H-Power (Watts) | Generated 3H-Power (Watts) |
|---|---|---|---|---|---|
| 20 | 350. | LBO | 231.10 | 10.13 | 0.83 |
| 40 | 495. | LBO | 390.30 | 28.14 | 3.77 |
| 60 | 606. | LBO | 513.30 | 47.70 | 8.22 |
| 20 | 350. | CBO | 215.40 | 8.82 | 2.01 |
| 40 | 495. | CBO | 343.40 | 21.95 | 7.78 |
| 60 | 606. | CBO | 435.80 | 34.81 | 15.39 |
| 20 | 350. | BBO | 226.00 | 9.69 | 1.21 |
| 40 | 495. | BBO | 373.70 | 25.87 | 5.22 |
| 60 | 606. | BBO | 484.60 | 42.71 | 10.95 |

It is also assumed that the fundamental spot size in all of the optically nonlinear crystals is 40 μm, and that all of the optically nonlinear crystals have a length of 20.0 mm. It is further assumed that 80% of generated 2H-radiation is converted back to fundamental radiation. Third harmonic generating crystals of LBO, CBO, and BBO are assumed to be cut and arranged as depicted in FIGS. 5, 7, and 9 respectively.

Table 2 lists calculated 4H-radiation power generated in a Nd:YVO$_4$ laser in accordance with above-described laser 54 of FIG. 3. Here again it is assumed that the second-harmonic generation and reconversion crystals 34 and 38, respectively, are LBO crystals cut as depicted in FIG. 5. It is also assumed that the fundamental spot size in all of the optically nonlinear crystals is 40 μm, and that all of the optically nonlinear crystals have a length of 20.0 mm. It is further assumed that 80% of generated 2H-radiation is converted back to fundamental radiation. Third-harmonic generating crystals of LBO, CBO, and BBO are assumed to be cut and arranged as depicted in FIGS. 5, 7, and 9 respectively. Fourth-harmonic generating crystal 40 is assumed to be a BBO crystal, cut and arranged as depicted for crystal 41 of FIGS. 11A and 11B.

Calculations corresponding to the calculations of TABLES 1 and 2 for Nd:YVO$_4$ lasers not including the inventive back-conversion of CW 2H-radiation indicate that the frequency-conversion method of the present invention can provide an efficiency improvement over that of prior-art lasers for third and fourth-harmonic generation ranging from about a factor of two, at lower (about 20 W) pump power, to three or more at higher (60 W or more) pump power. This efficiency improvement is about the same for fourth-harmonic generation as for third-harmonic generation as it is primarily the efficiency improvement for third-harmonic generation that provides the efficiency improvement for fourth-harmonic generation. Those skilled in that art will recognize, for this reason alone, that similar efficiency increases in fifth and higher-harmonic generation could be realized by including one or more additional optically nonlinear crystals in above-described and other embodiments of the inventive lasers.

It is pointed out here that only basic resonator arrangements are illustrated in FIGS. 1–4 for purposes of highlighting the placement of optically nonlinear crystals in the lasers and the sequence of interaction with fundamental and harmonic radiations with the crystals. Elements such as a Faraday isolator for causing fundamental radiation F to circulate in the laser resonator in one direction only (traveling-wave resonator) and any polarization control elements that may be required ahead of any of the optically nonlinear crystals are not shown. The placement of such elements is well known to those skilled in the art and is exemplified, herein, in a description of an additional, particularly preferred embodiment of a traveling-wave ring resonator in accordance with the present invention set forth below with reference to FIG. 17, and FIG. 18.

Figure 17:
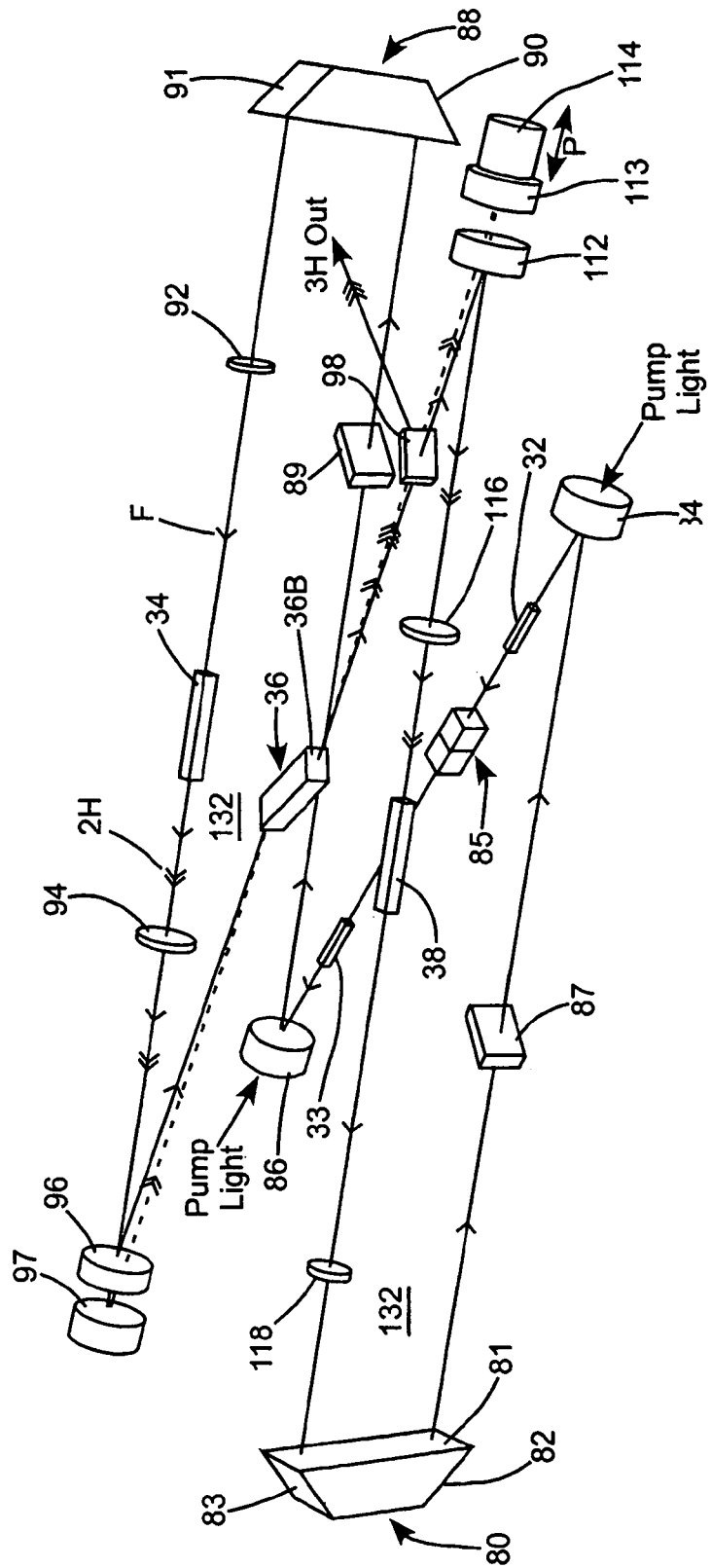
FIG. 17 is a three-dimensional view schematically illustrating an additional embodiment of an intracavity frequency-tripled, CW laser in accordance with the present invention, including a bi-planar traveling wave ring-resonator formed by two Dove prisms, two lenses and six concave mirrors the resonators including two solid-state gain elements, and three optically nonlinear crystals and wherein four of the concave mirrors are arranged as two spaced apart pairs thereof configured and aligned to provide different paths for fundamental and second harmonic reflection between the mirrors.
Figure 18:
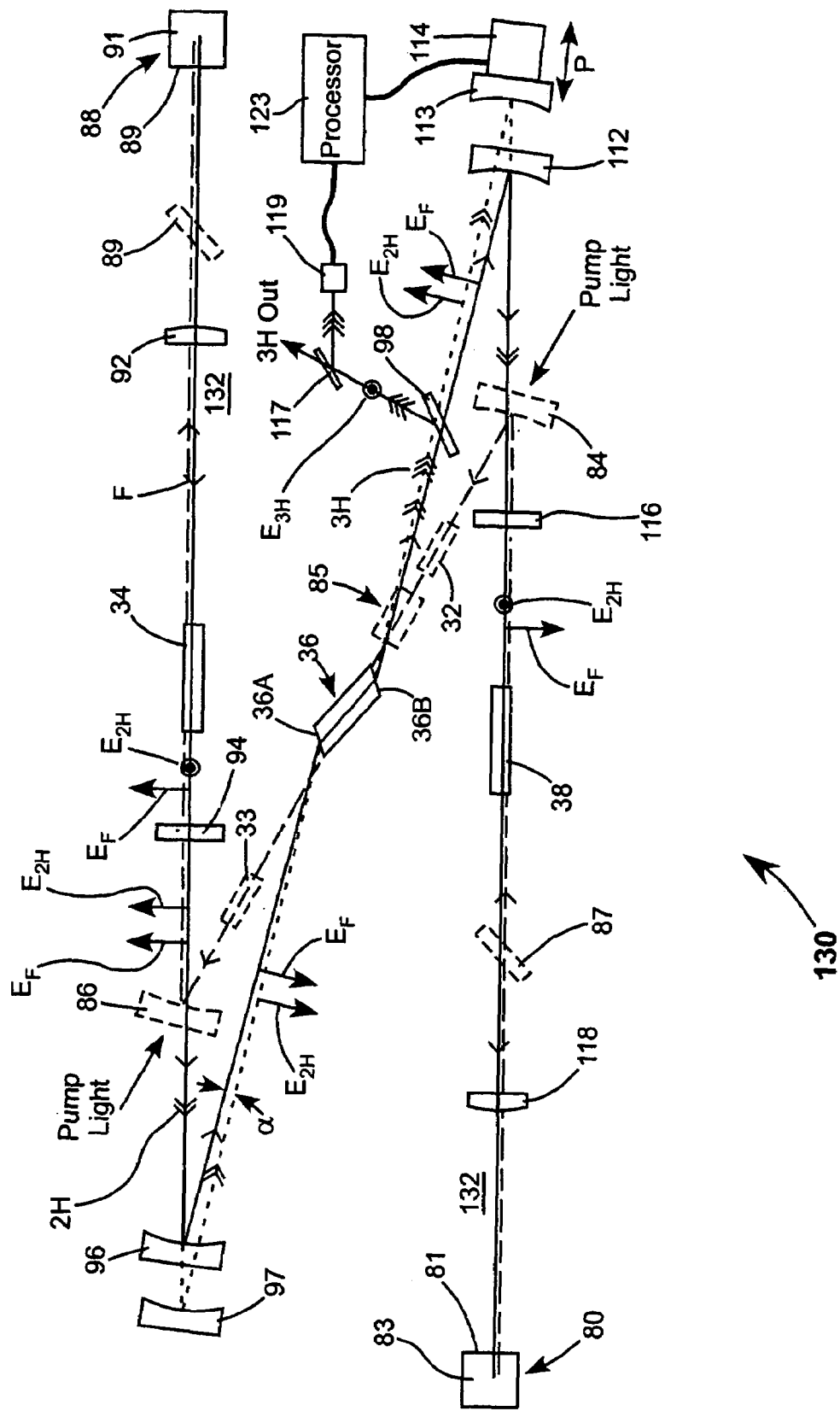
FIG. 18 is a plan view from above view schematically illustrating detail of polarization orientations of fundamental and second-harmonic radiation in the resonator of FIG. 17.

FIG. 17, and FIG. 18, schematically depict an additional embodiment 130 of a laser in accordance with the present invention includes a bi-planar traveling-wave ring resonator 132. Resonator 132 is arranged to accommodate the crystal cut arrangement of FIGS. 13A and 13B with type 1 phase matching for third-harmonic generating crystal 36. In FIG. 17, laser 130 is depicted in three-dimensional form to

TABLE 2

| Pump Power (Watts @ 810 nm) | Spot Size in Nd:YVO$_4$ μm | THG Crystal material (20mm) | Circulating Fundamental Power Watts | Generated 2H-Power Watts | Generated 3H-Power Watts | Generated 4H-Power Watts @ 266 nm |
|---|---|---|---|---|---|---|
| 20 | 350. | LBO | 230.90 | 10.11 | 0.83 | 0.06 |
| 40 | 495. | LBO | 389.30 | 27.99 | 3.74 | 0.42 |
| 60 | 606. | LBO | 510.90 | 47.27 | 8.11 | 1.19 |
| 20 | 350. | CBO | 215.00 | 8.79 | 2.00 | 0.13 |
| 40 | 495. | CBO | 341.90 | 21.77 | 7.69 | 0.76 |
| 60 | 606. | CBO | 432.90 | 34.37 | 15.11 | 1.85 |
| 20 | 350. | BBO | 225.70 | 9.67 | 1.21 | 0.08 |
| 40 | 495. | BBO | 372.40 | 25.70 | 5.17 | 0.56 |
| 60 | 606. | BBO | 481.90 | 42.25 | 10.77 | 1.48 |

It appears from the computed third and fourth-harmonic powers of TABLES 1 and 2, that in all exemplified embodiments of lasers incorporating the inventive third-harmonic generation scheme, the highest conversion efficiency of pump-power to generated third or fourth harmonic power is achieved when an optically nonlinear crystal of CBO is used for third-harmonic generation. In practice, however, BBO is preferred as providing a good compromise between conversion efficiency and availability of good quality crystals.

illustrate the spatial arrangement of components in two planes arranged one above the other. In FIG. 18 details of polarization orientation of fundamental (F) and second harmonic (2H) radiation at various locations in the resonator are depicted. In FIG. 16 radiation paths and optical components in the lower and upper planes are indicated by long dashed lines and solid lines, respectively. A partially separate path for 2H radiation in the upper plane is depicted by dotted lines. In both FIGS. 17 and 18, the direction of circulation of fundamental, second harmonic, and third-harmonic radiations are indicated by single double and triple arrowheads respectively. The resonator is configured to provide Type 1 phase-matching for fundamental and 2H-radiation in an optically nonlinear crystal 36 with input radiations incident at the Brewster angle on entrance and exit faces 36A and 36B of the optically nonlinear crystal. Details of crystal cut angles are discussed above with reference to FIGS. 15A, 15B and 16. Radiation circulating in resonator 132 is directed from the upper to the lower plane thereof by a Dove prism 80 having a lower and upper total internal reflecting surfaces 82 and 83 and an entrance and exit face 81. Circulating radiation is directed from the lower to the upper plane of resonator 132 by a Dove prism 88 having a lower and upper reflecting internal reflecting surfaces 90 and 91 and an entrance and exit face 89 (not shown in FIG. 17).

Beginning, here arbitrarily, in the lower plane, fundamental radiation, plane polarized parallel to the plane of incidence of the resonator mirrors, i.e., parallel to the plane of the drawing, progresses in compound resonator 132 from a concave mirror 84, through a first solid-state gain-element 32, a Faraday isolator 85 and a second solid-state gain-element 33, to a concave mirror 86. Mirrors 84 and 86, here, are coated to be highly reflective, for example, greater than 99% reflective, at the wavelength of fundamental radiation, and highly transmissive, for example, greater than 90% transmissive for the wavelength of pump light directed though the mirrors into the gain elements. Gain elements 32 and 33 are, of course, the elements that cause fundamental radiation to be generated. Faraday isolator 85 forces unidirectional circulation of radiation resonator 132.

After reflection from concave mirror 86, radiation fundamental radiation then passes through a plane optical element 89 that serves to compensate for astigmatism introduced by mirrors 84 and 86 being used at non-normal incidence angles. The fundamental radiation is then internally reflected sequentially from lower and upper faces 90 and 91, respectively, of Dove prism 88. After exiting Dove prism 88, the fundamental radiation is focused by a positive lens 92 into a second harmonic generating optically crystal 34. Fundamental radiation leaves optically nonlinear crystal 34 still plane polarized parallel plane of incidence of the resonator mirrors (hereinafter, horizontally polarized), and a portion of the fundamental radiation that has been converted to 2H radiation exits the optically nonlinear crystal plane polarized perpendicular to the plane of the mirrors (hereinafter vertically polarized) as indicated in FIG. 18 by arrow $E_F$ and arrowhead $E_{2H}$ respectively.

The fundamental and 2H-radiation traverse a polarization rotator (waveplate) 94. Waveplate 94 is configured to rotate the polarization plane of the 2H-radiation by an odd integer multiple of half-wavelengths of the 2H-radiation and to rotate the polarization plane of the fundamental radiation by an integer multiple of wavelengths of the fundamental radiation. Accordingly, after traversing waveplate 94 both the fundamental and 2H-radiations are parallel polarized.

The fundamental and 2H-radiation is next incident on a concave mirror 96. Mirror 96 is coated to be highly reflective for fundamental radiation and highly transmissive for 2H-radiation. Fundamental radiation is reflected from mirror 96. 2H-radiation is transmitted through mirror 96 and is incident on a mirror 97 spaced apart from mirror 96. Mirror 97 is coated to be highly reflective for 2H radiation. 2H-radiation is reflected from mirror 97, is transmitted through mirror 96, and follows a path (indicated in FIGS. 17 and 18 by a dotted line at an angle α to the path of the fundamental radiation reflected from mirror 96). The spacing of mirrors 96 and 97 is selected such that the paths of the fundamental and 2H-radiation converge on an entrance face 36A of an optically nonlinear crystal 36 and follow a common path through the crystal. Entrance face 36A of the crystal is cut at an angle to the longitudinal axis of the crystal and crystal 36 is oriented to the incident radiation paths such that face 36A is at the corresponding Brewster angle to each of the radiation paths.

The fundamental and 2H-radiations mix in optically nonlinear crystal 36 and a portion of each is converted to third harmonic (3H) radiation. Unconverted fundamental and 2H-radiations leave exit face 36B of optically nonlinear crystal 36 at the corresponding Brewster angles and paths diverging at angle α, with the 2H-radiation path again designated by a dotted line. The fundamental and 2H-radiations remain horizontally polarized. 3H radiation exits optically nonlinear crystal along a path between the fundamental and 2H radiations but sufficiently close to the path of the 2H-radiation that the 3H-radiation path is not separately designated in FIGS. 17 and 18. The 3H-radiation is vertically polarized.

The fundamental, 2H, and 3H-radiations are incident on a beamsplitter 98. Beamsplitter 98 is coated to be highly transmissive for the fundamental and 2H-radiations and highly reflective for the 3H-radiation. Beamsplitter 98 reflects the 3H-radiation out of the resonator as output radiation (3H Out). Fundamental and 2H-radiation transmitted by beamsplitter 98 are incident on a mirror 112. Mirror 112 coated similar to mirror 96 and reflects the fundamental radiation while transmitting the 2H-radiation. 2H-radiation is transmitted through mirror 112 and is incident on a mirror 113 spaced apart from mirror 112. Mirror 113 is coated to be highly reflective for 2H-radiation. 2H-radiation is reflected from mirror 113 and is transmitted through mirror 112. The spacing of mirrors 112 and 113 is selected such that the paths of the 2H-radiation is reflected from mirror 113 back through mirror 112 on a common path with the fundamental radiation reflected from mirror 112. The spacing can be varied by up to about 550 nm by moving mirror 113 with a piezo-electric transducer (PZT) actuator 114, for reasons discussed in detail further hereinbelow.

Fundamental and 2H-radiations, still both horizontally polarized, proceed from mirror 112 to a waveplate 116. Waveplate 116 is configured similar to waveplate 94 such that the polarization plane of the 2H-radiation is rotated by an odd integer multiple of half-wavelengths thereof, and the polarization plane of the fundamental radiation is rotated by an integer multiple of wavelengths thereof. Accordingly, after traversing waveplate 116, the fundamental remains horizontally polarized and the 2H-radiation is vertically polarized. The fundamental and 2H-radiations then enter an optically nonlinear crystal 38 wherein a substantial portion, for example about 80% or more, of the 2H-radiation is converted back to fundamental radiation. The fundamental radiation and that portion of 2H-radiation that has not been converted back to fundamental radiation traverse a lens 118, are internally reflected sequentially from faces 83 and 82 of a Dove prism back into the lower plane of the resonator returning to concave mirror 84.

Optimum reconversion of 2H-radiation occurs in an optically nonlinear crystal when the phase of 2H-radiation leads (rather than lags) in phase by 90° the nonlinear polarization induced by the fundamental, as discussed above. One method of controlling the relative phase of the fundamental and 2H-radiations in embodiments of the present invention, also discussed above, is to vary the temperature of the optically nonlinear crystal (crystal 36 in all embodiments)

used for mixing fundamental and 2H-radiations to provide 3H-radiation. While effective, this method of phase control is slow in response and requires a compensating variation of phase-angle with variation of crystal temperature.

In the arrangement of resonator 132 the path lengths, and accordingly the relative phase of the fundamental radiation are directly adjustable by varying the position of mirror 113 with respect to mirror 112 via PZT actuator 114. A full $2\pi$ variation of the relative phase of fundamental and 2H-radiation can be accomplished by a change in spacing of the mirrors of only about 275 nm. This provides that the range of motion is well within the range of motion possible using actuator 114 and is sufficiently small that it has negligible effect on the ability of mirrors 112 and 113 to recombine fundamental and 2H-radiations on a common path. Further, as a change in spacing can be effected via PZT actuator 114 in less than a few millisecond (ms), the phase adjusting method lends itself to closed-loop control. The phase relationship may also be adjusted by similarly adjusting the spacing of mirrors 96 and 97.

One method of effecting such closed loop control is to direct a sample portion, for example about 1%, of output 3H-radiation via a beamsplitter 117 to a detector 119, such as a photodiode. The output of detector 119 is proportional to the 3H output power of laser 130. The detector output is connected to a processor 123. Processor 123 commands PZT actuator 114 to move mirror 113 reciprocally as indicated by arrow P while monitoring the resulting change in output of detector 119. This enables the processor to determine the direction in which mirror should be moved to optimize 3H output power this optimization resulting, inter alia, from an optimization of the phase relationship of fundamental and 2H-radiation entering optically nonlinear crystal 38.

It is anticipated that once the phase adjustment is optimized, the laser will then be self-locked to an operating mode frequency for which the phase relationship between fundamental and 2H-radiation is exactly the desired relationship discussed above, i.e., 2H-radiation leads in phase by 90° the nonlinear polarization induced in crystal 36 by the fundamental radiation. It is also very probable that the laser will spontaneously self-lock to this frequency without any immediate adjustment of the position of mirror 113 being necessary. This is discussed in detail further hereinbelow.

Figure 19:
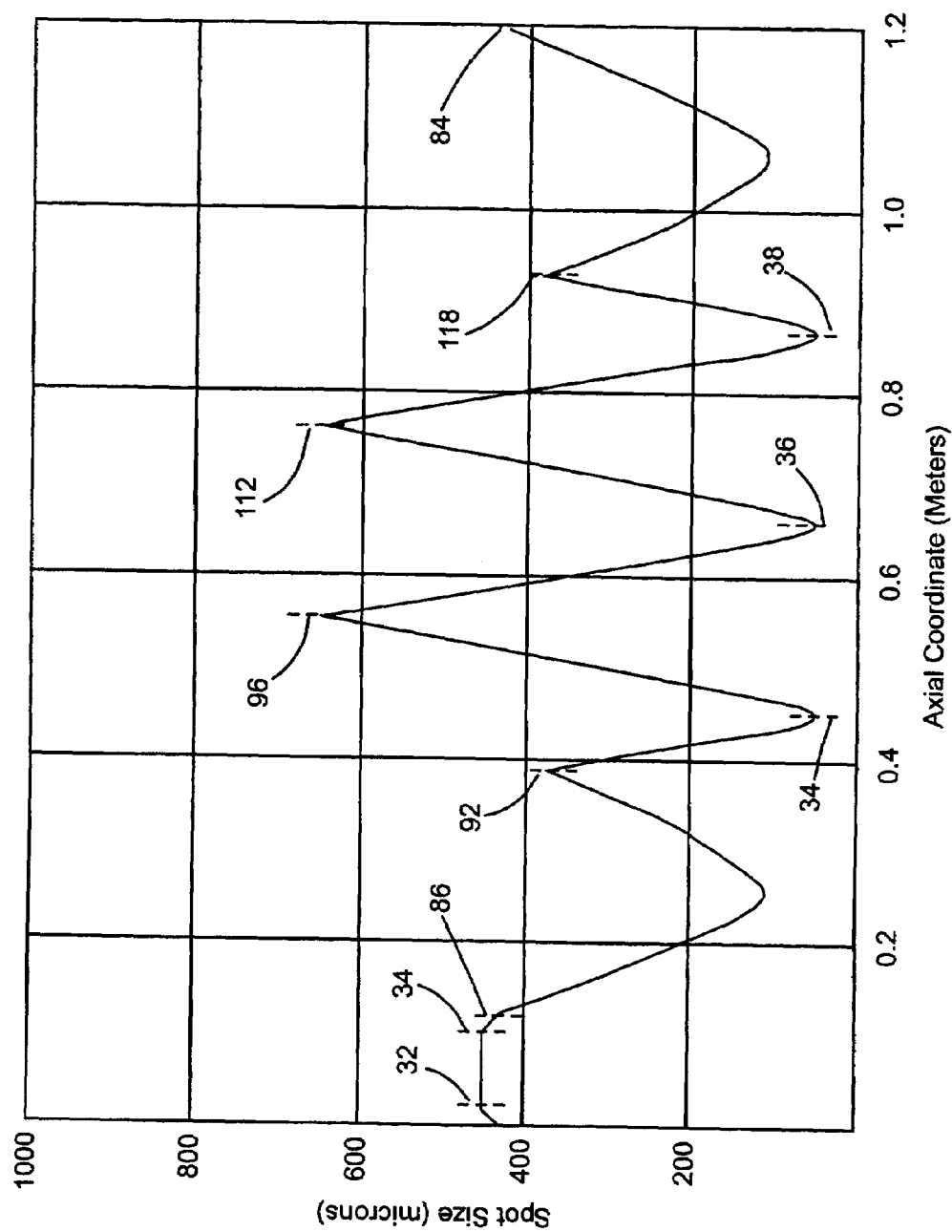
FIG. 19 is a graph schematically illustrating calculated mode sizes in the ring resonator of FIG. 17.

FIG. 19 is a graph representing computed size of a circulating beam of fundamental radiation as a function of position in the resonator in one example of laser 130. The beam size represented for 2H-radiation between optically nonlinear crystals 34 and 38 is about equal to the beam size of fundamental radiation divided by the square root of two. Optical component locations are depicted by vertical dashed lines designated by a corresponding reference numeral. In this computation it is assumed that gain elements 32 and 33 are Nd:YVO$_4$ having a length of about 9.0 mm, optically nonlinear crystals 34 and 38 are assumed to be crystals of LBO having a length of about 20.0 mm. Optically nonlinear crystal 36 is assumed to be a crystal BBO having a length of about 15.0 mm. Mirrors 84 and 86 are assumed to have a concave radius of curvature (ROC) of 500 mm. Mirrors 96 and 112 are assumed to be on a plano-concave substrate having a concave ROC of 100 mm, and mirrors 97 and 113 are assumed to have a ROC of 77.3 mm. The ROC of mirrors 97 and 113 is shorter than that of mirrors 96 and 112 to compensate for the negative dioptric power of the substrates of mirrors 96 and 112. Mirror 97 is assumed to be axially spaced from mirror 96 by about 5.0 mm, and mirror 113 is similarly spaced from mirror 112. Lenses 92 and 118 each have a focal length of about 36.0 mm. Computations indicate that a 3H-output power of about 5.0 W is possible for a total pump light power of about 40.0 W, i.e., a conversion efficiency for pump light to 3H output of about 12.5%.

Returning now to a discussion of phase relationship between fundamental and 2H-radiations entering 2H-reconverting crystal 38, it is mentioned above that laser 130 may spontaneously self-lock, or be urged to self-lock to a lasing mode frequency at which this phase relationship is optimum. A reason for this is that, because of the spacing between mirrors 96 and 97, and between mirrors 112 and 113, which as noted above is about 5.0 mm, the 2H-radaiation follows a path to crystal 38 that is 20.0 mm longer than the path followed by the fundamental radiation. A result of this is that the phase relationship of the fundamental and 2H-radiation is frequency dependent to an extent that there can be many possible lasing modes of resonator 132 within the gain bandwidth of gain elements 32 and 33 for which the phase relationship at crystal 38 is at or close to the optimum phase relationship, without any adjustment of the position of the mirror being necessary.

Figure 20:
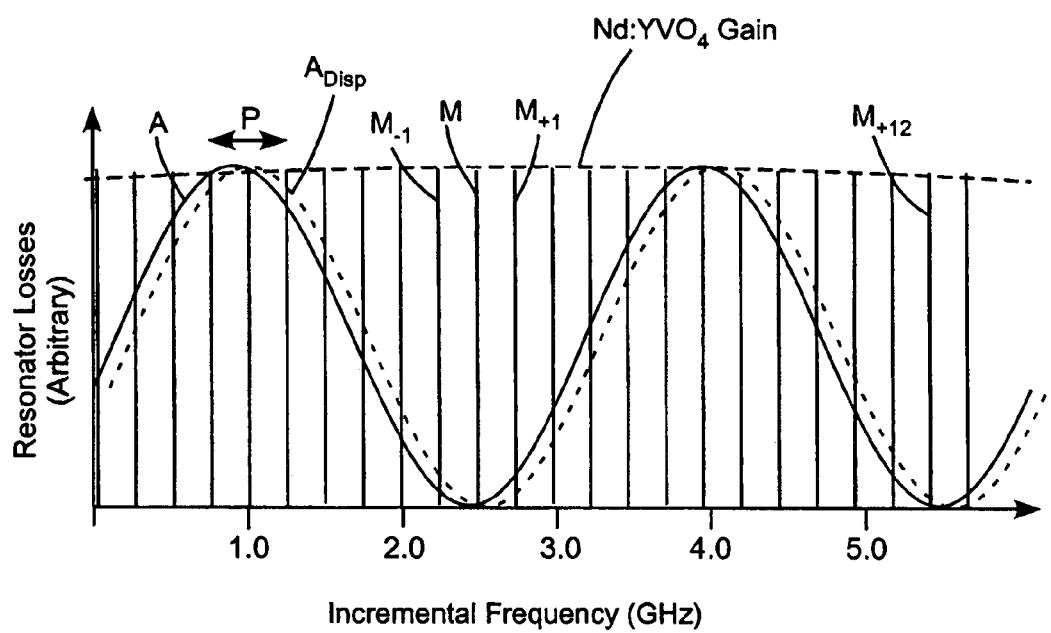
FIG. 20 is a graph schematically illustrating a period variation of resonator losses as a function of laser radiation frequency resulting from the path difference between fundamental and second-harmonic radiation in the laser of FIG. 17.

FIG. 20 is a graph schematically illustrating estimated resonator losses for fundamental radiation a function of lasing frequency (curve A) for a 5.0 mm spacing of mirrors 112 and 113. This is directly related to a frequency dependent variation of the phase relationship between the fundamental and 2H-radiation at the crystal. Losses would be highest if crystal 38 were to generate further 2H radiation rather than reconverting 2H-radiation to fundamental, and lowest, of course, when the F to 2H phase relationship is optimum and 2H-radiation is optimally reconverted to fundamental radiation. The period of frequency dependence inversely proportional to the mirror spacing and is about 3.0 gigahertz (GHz) for the spacing of mirrors 96 and 97, and 112 and 113.

The fundamental wavelength of about 1064 nm of Nd:YVO$_4$ expressed as a frequency is about 281.7 Terahertz (THz). Only an arbitrary incremental frequency is depicted in FIG. 20 to highlight frequency spacings. The frequency spacing of possible fundamental modes in resonator 132 is about 300.0 megahertz (MHz)). Possible mode frequencies are indicated by vertical bars. The frequency spacing of the modes is determined by the fundamental frequency and the round trip length of the resonator. The gain (long dashed curve) of Nd:YVO$_4$ has a frequency-bandwidth of about (30 GHz).

The period of the frequency variation of the fundamental-2H phase relationship is such that an optimum phase relationship (lowest fundamental loss) occurs at two or more frequencies in the gain bandwidth. As a laser will always lase at that frequency in the gain bandwidth for which resonator losses are lowest and gain is highest, then laser 130 will self-select a mode at which the phase relationship is optimum for converting 2H-radiation to fundamental radiation.

As exemplified in FIG. 20 the self-selected frequency would be that of mode frequency M. Mode frequencies $M_{-1}$ and $M_{+1}$ the frequencies of the next lowest and next highest frequency modes respectively have higher loss than mode frequency M. Mode frequency $M_{+12}$ is in a (different) lowest loss region of the periodic loss variation curve, but in a lower gain region of the Nd:YVO$_4$ gain curve. Accordingly this mode would probably not be self-selected.

In the case where two modes such as M and $M_{-1}$ have about equal probability of being selected, laser 130 may lase by "mode hopping" from one mode to the other. This probability can be minimized by fine-adjusting the position of mirror 113 in the direction of arrows P (see FIG. 18) and correspondingly displacing curve A to a new position $A_{Disp}$ (dotted curve in FIG. 20). By way of example, a mirror position adjustment of only about 15 nm would be necessary to provide the displacement of curve A to curve $A_{Disp}$. Mirror position adjustment may also be necessary to compensate for any drift of the mode frequencies due, for example, to temperature changes in resonator 132. Mirror position may also be adjusted to align a low loss period with the peak of the gain curve. In general, it is preferred that the period of frequency variation is less than the gain bandwidth of gain elements 32 and 33 but greater than the fundamental mode-frequency spacing of resonator 132.

Referring again to FIGS. 17 and 18, in the arrangement of laser 130 the frequency periodicity of variation of the phase relationship between fundamental and 2H-radiation is adjustable only over a range of about a few hundred nanometers and is dictated by the spacing of mirrors 96 and 97, and 112 and 113. This spacing is determined, in turn, by the angular divergence of the fundamental and 2H radiations. It would be advantageous to embody the inventive phase self-selection mechanism in resonator configurations wherein there was no divergence between fundamental and 2H-radiation. It would further be advantageous if the path difference could be varied in a manner in which the period of variation of the phase relationship could be independently selected. A description of embodiments of the present invention in which this is possible is set forth below with reference to FIGS. 21 and 22.

Figure 21:
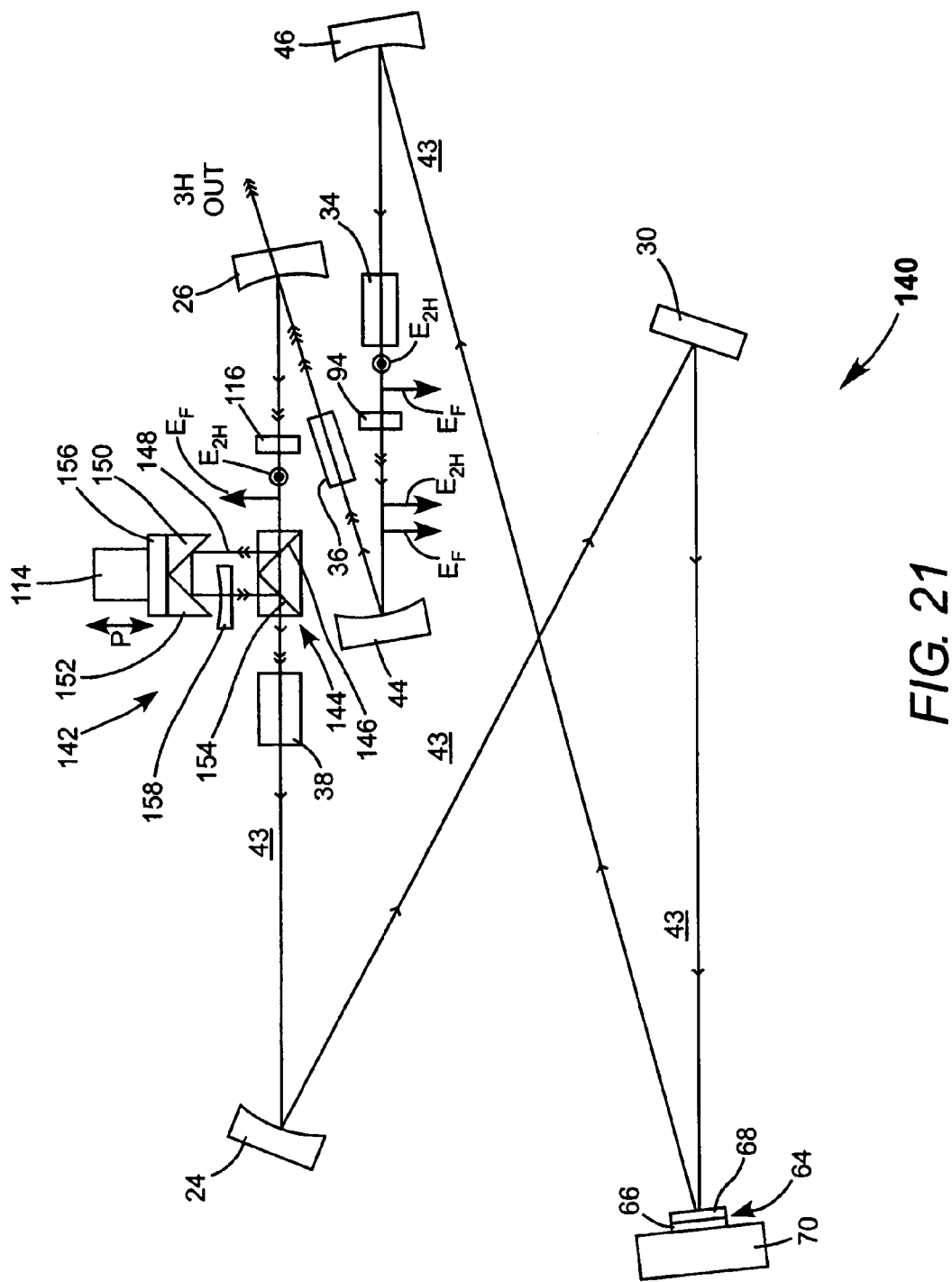
FIG. 21 schematically illustrates another additional embodiment of an intracavity frequency-tripled, CW laser in accordance with the present invention, similar to the laser of FIG. 4, but including a polarization selective optical arrangement configured to create a path difference between fundamental and second-harmonic radiation for causing the frequency dependent variation of resonator losses of the laser of FIG. 17.

FIG. 21 schematically illustrates another additional embodiment 140 of an intracavity frequency-tripled, CW laser in accordance with the present invention. Laser 140 is similar to laser 120 of FIG. 4 but includes a polarization-selective optical arrangement 142 configured to create a path difference between fundamental and second-harmonic radiation for causing the frequency dependence of phase relationship at 2H-radiation reconverting crystal 38 between the fundamental and 2H-radiation. The 2H-generating crystal 36 is arranged for type 1 phase matching, but with ends square cut such that fundamental and 3H radiations exit the crystal on a common path. Waveplates 94 and 116 are included for rotating the polarization of fundamental and 2H-radiations as discussed above with respect to laser 130.

Phase adjusting arrangement 142 includes a polarizing beamsplitter and re-combiner 144 located between waveplate 116 and crystal 38. At an internal surface 146 of the polarizing beamsplitter and re-combiner, 2H-radiation is reflected and fundamental radiation transmitted. The 2H-radiation follows a path 148 and is reflected sequentially from 45'-inclined mirrors 150 and 152 back into polarizing beamsplitter and re-combiner 144. The 2H-radiation is reflected at internal surface 154 of the polarizing beamsplitter and re-combiner and then follows a common path with fundamental radiation into crystal 38.

An advantage of the arrangement 142 for causing a path difference between fundamental and 2H-radiations is that this path difference can be independently selected for optimum self-selecting and self-locking effect of the phase-relationship between the fundamental and 2H-radiation. Optionally, a lens 158, here, negative, may be included in the 2H-radiation beam path 148 to compensate for the longer 2H-radiation path and optimize 2H-beam spot-size in crystal 38. Mirrors 150 and 152 are mounted on a carrier plate 156 driven by a piezoelectric actuator 114 for making above discussed fine adjustments of mirror spacing. Actuator 114 can be operated by closed loop control as discussed above with respect to actuator 114 of laser 130 (see FIG. 16).

Figure 22:
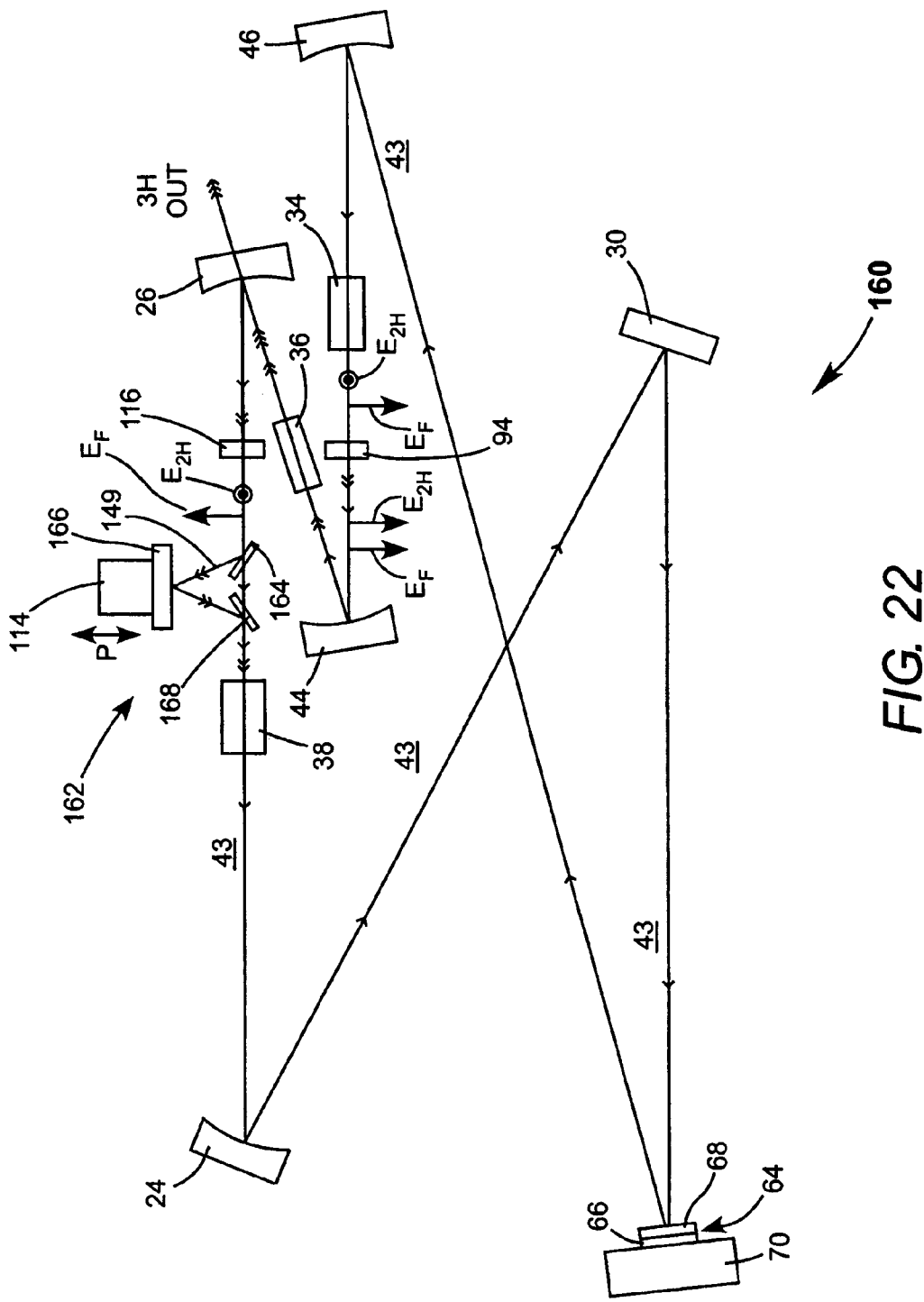
FIG. 22 schematically illustrates another additional embodiment of an intracavity frequency-tripled, CW laser in accordance with the present invention, similar to the laser of FIG. 4, but including a wavelength selective optical arrangement configured to create a path difference between fundamental and second-harmonic radiation for causing the frequency dependent variation of resonator losses of the laser of FIG. 17.

FIG. 22 schematically illustrates yet another additional embodiment 160 of an intracavity frequency-tripled, CW laser in accordance with the present invention. Laser 160 is similar to the laser 140 of FIG. 21, but includes a wavelength selective optical arrangement 162 rather than a polarization-selective arrangement to create a path difference between fundamental and second-harmonic radiation.

Phase adjusting arrangement 162 includes dichroic mirrors 164 and 168 inclined to the path of radiation incident thereon. The dichroic mirrors are coated to be highly reflective for 2H radiation and highly transmissive for fundamental radiation. The 2H-radiation incident on dichroic mirror 164 is reflected along a path 149 then reflected from a mirror 166 onto dichroic mirror 168. At mirror 168, the 2H-radiation is reflected back along a common path with transmitted fundamental into crystal 38.

The present invention is described above with reference to generating second-harmonic radiation from fundamental radiation for conversion to third and higher-harmonic radiation. The invention is equally applicable, however, for converting the second harmonic radiation to radiation of another, non-harmonic, frequency by a parametric interaction process. The optical parametric interaction process is well known in the art and is described only briefly herein as follows.

In a parametric interaction process an optically nonlinear crystal converts radiation of a particular frequency (referred to as pump-radiation) to radiation at two different frequencies which are generally referred to as a signal frequency and an idler frequency. The sum of these frequencies is equal to the pump-radiation frequency. The higher of the converted frequencies is usually designated the signal frequency. These signal and idler frequencies have a non-integer relationship with the pump frequency, and either one may be selected as an output frequency. The signal-frequency (and corresponding idler-frequency) may be continuously tuned over a range of frequencies. Tuning may be effected, for example, by adjusting the angle of the optically nonlinear crystal with respect to the direction of propagation of the pump radiation, or by varying the temperature of the optically nonlinear crystal. One preferred optically nonlinear crystal material for providing optical parametric interaction is BBO.

Figure 23:
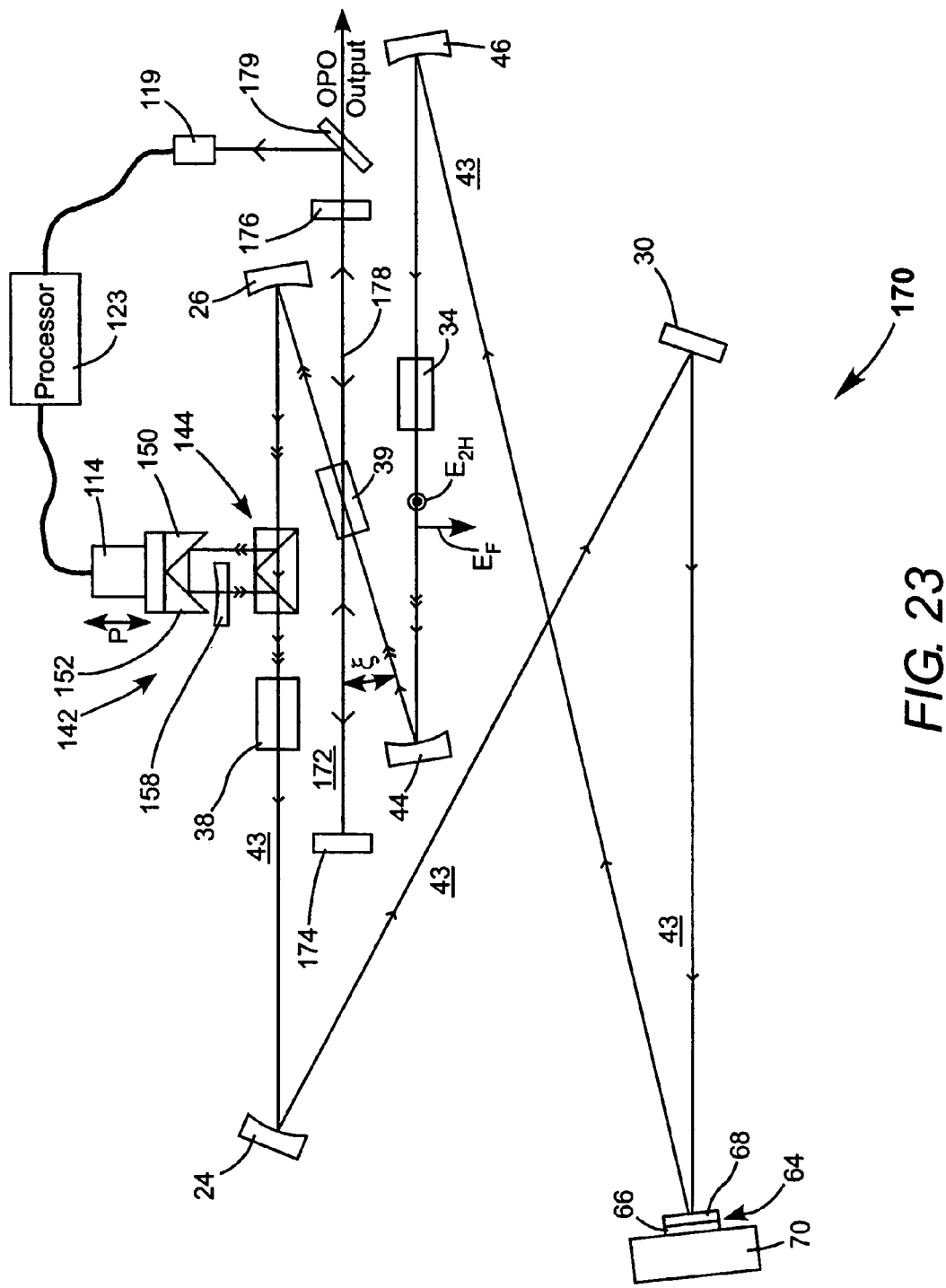
FIG. 23 schematically illustrates one preferred embodiment of an optical parametric oscillator non-collinearly pumped by second-harmonic radiation generated in a traveling wave resonator in accordance with the present invention including an OPS structure for generating fundamental radiation, a first optically nonlinear crystal for generating second-harmonic pump radiation from the fundamental radiation, a second optically nonlinear crystal for parametrically converting a portion of the pump radiation to radiation having a different frequency from that of the pump radiation, and a third optically nonlinear crystal for re-converting unconverted second-harmonic pump radiation to fundamental radiation.

FIG. 23 schematically illustrates one preferred embodiment of an optical parametric oscillator (OPO) 170 in accordance with the present invention. Optical parametric oscillator 170 includes a traveling-wave resonator 43 similar to the resonator of laser 160 of FIG. 21, with an exception that optically nonlinear crystal 36 of laser 160 is replaced in OPO 170 by an optically nonlinear crystal 39 arranged for optical parametric interaction of the 2H-radiation, and with an exception that polarization rotators 94 and 116 of laser 160 are omitted in OPO 170. Optically nonlinear crystal 39 is co-located in a straight standing-wave resonator 172 formed between mirrors 174 and 176. Resonator 172 has a resonator axis 178.

It should be noted, here, that as both fundamental and 2H-radiation traverse optically nonlinear crystal 39 both will parametrically interact, thereby providing two signal frequencies and two idler frequencies. By providing wavelength selective coatings for mirrors 174 and 176, resonator 172 is arranged to be a resonator only for the signal light frequency generated by 2H-radiation. Accordingly, optically nonlinear crystal 39 will provide optical gain only for radiation (light) of that frequency, and that frequency will be the frequency of the OPO output.

Optical parametric oscillation here is achieved in a so-called non-collinearly pumped arrangement inasmuch as resonator axis 178 is inclined at an angle ξ to the direction of propagation of 2H-radiation in optically nonlinear crystal 39, i.e., inclined at an angle ξ to the resonator axis of traveling-wave resonator 43. Angle ξ is somewhat exaggerated in FIG. 23 for convenience of illustration. Mirror 174 is highly reflective at signal-light frequency generated by parametric interaction of the 2H-radiation, designated in FIG. 21 by large single arrowheads. Mirror 176 is partially reflective and partially transmissive at the signal-light frequency generated by parametric interaction of the 2H-radiation, and serves as an outcoupling mirror for signal-light (OPO output) from resonator 172. Mirrors 174 and 176 are highly transmissive, for example greater than 95% transmissive, at the signal-light frequency generated by parametric interaction of fundamental radiation and either highly transmissive or strongly absorptive for the idler frequencies generated by interaction of fundamental and 2H-readiations.

Phase control for re-converting 2H-radiation to fundamental radiation is effected by apparatus 142 described above with reference to laser 160. A portion of the OPO output may be sampled via a beamsplitter 179 and a detector 119. The sampled output can be optimized, as described above, by adjusting the optical path length of 2H-radiation in apparatus 142 via piezoelectric actuator 114 and processor 123.

Figure 24:
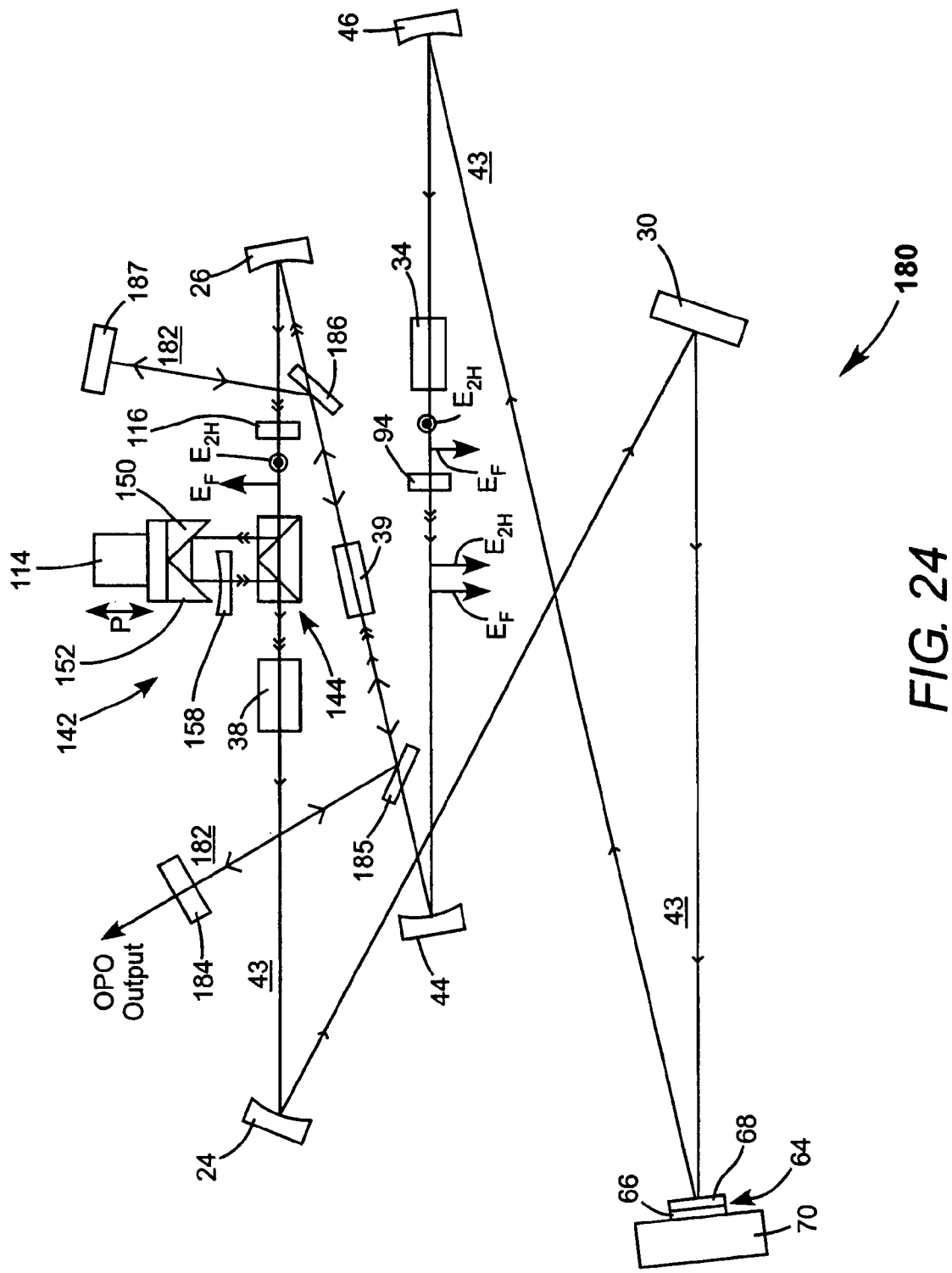
FIG. 24 schematically illustrates another preferred embodiment of an optical parametric oscillator similar to the oscillator of FIG. 23 but wherein the second optically nonlinear crystal is collinearly pumped.

Optical parametric interaction is also possible in so-called collinear pumped arrangements wherein signal-light and pump-light traverse the optically nonlinear crystal generally along a common axis. FIG. 24 schematically depicts a collinear pumped OPO 180 in accordance with the present invention. OPO 180 is similar to OPO 170 of FIG. 23 with an exception that straight OPO resonator 172 of laser 170 is replaced by a folded standing-wave resonator 182. Resonator 182 is formed by an end mirror 184, fold mirrors 185 and 186, and another end mirror 187. Fold mirrors 185 and 186 are each coated to be highly reflective for the signal radiation and highly transmissive for the fundamental and 2H-radiation of resonator 43. Mirror 187 is highly reflective for the converted-frequency (signal-light wavelength). Mirror 184 is partially reflective and partially transmissive for the signal-light wavelength and serves as an outcoupling mirror for signal-light (OPO output) from resonator 182. Fold mirrors 185 and 186 are located on the resonator axis of traveling-wave resonator and aligned such that resonators 182 and 43 are coaxial between the fold mirrors, with optically nonlinear crystal 39 being located in this coaxial path. Waveplate 94 causes fundamental and 2H-radiation exiting optically nonlinear crystal to be polarized in the plane of incidence of the resonator mirrors. This allows mirrors 185 and 186 to be inclined at Brewster's angle to the resonator axis, thereby eliminating the need for an antireflective coating on the non-mirrored surface of the mirrors. Waveplate 116 restores the relative polarizations of fundamental and 2H-radiation to the states required for reconverting 2H-radiation to fundamental radiation in optically nonlinear crystal 38.

Figure 25:
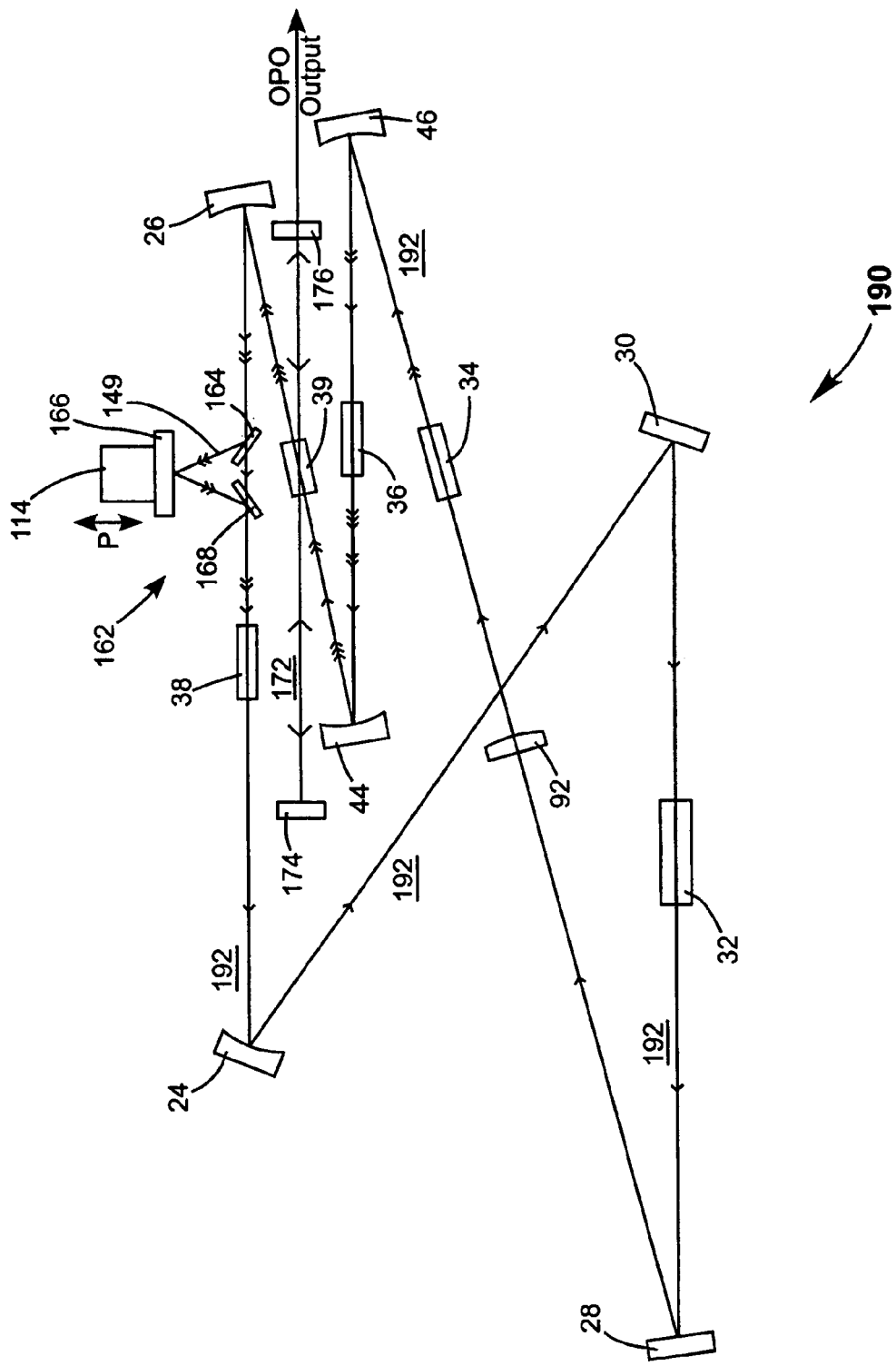
FIG. 25 schematically illustrates another preferred embodiment of an optical parametric oscillator non-collinearly pumped by third-harmonic radiation generated in a traveling wave resonator in accordance with the present invention including a solid-state gain-element for generating fundamental radiation, a first optically nonlinear crystal for generating second-harmonic pump radiation from the fundamental radiation, a second optically nonlinear crystal for generating the third-harmonic pump radiation from a portion of the fundamental and second-harmonic radiations, a third optically nonlinear crystal for parametrically converting a portion of the pump radiation to radiation having a different frequency from that of the pump radiation, and a fourth optically nonlinear crystal for re-converting an unconverted portion of the second-harmonic radiation to fundamental radiation.

FIG. 25 schematically illustrates yet another embodiment 190 of an OPO in accordance with the present invention. OPO 190 is similar to OPO 170 with exceptions as follows. In OPO 190 a solid-state gain-element 32 is provided in place of an OPS gain structure. In OPO 190, third-harmonic radiation is used to pump an optically nonlinear crystal 39 arranged for optical parametric interaction.

OPO 190 includes a traveling-wave resonator 192 in which optically nonlinear crystal 39 is located. Optically nonlinear crystal 39 is co-located in a standing-wave resonator 172 as described above with reference to OP 170.

Resonator 190 includes a lens 92 located between resonator mirrors 28 and 46. Optically nonlinear crystal 34 for generating 2H-radiation is located between lens 92 and mirror 46. An optically nonlinear crystal 36 located between mirrors 44 and 46 generates 3H-radiation from portions of the fundamental and 2H-radiations. The 3H-radiation provides the pump radiation for optically nonlinear crystal 39. Residual 2H-radiation from the 3H-radiation generating process is re-converted to fundamental radiation in optically nonlinear crystal 38. In OPO 190, phase control apparatus 142 replaces phase control apparatus 162 of OPO 170.

It should be noted here that an OPO in accordance with the present invention is not limited to pumping an optical parametric interaction crystal such as crystal 39 with 2H-radiation or 3H-radiation. Those skilled in the art will recognize from the above presented descriptions of inventive OPO apparatus and inventive harmonic-generating lasers, without further description or illustration, that OPO apparatus in accordance with the present invention can be configured to pump the parametric mixing crystal 39 with fourth or higher-harmonic radiation.

In summary, the invention is described above with reference to a preferred and other embodiments. The invention is not limited, however, to the embodiments described and depicted. Rather, the invention is limited only by the claims appended hereto.

What is claimed is:

1. A laser, comprising:
    a traveling wave ring laser resonator;
    first, second, and third optically nonlinear crystals located in said ring resonator;
    said ring resonator including at least one gain-element generating fundamental radiation in said ring resonator, said fundamental radiation circulating through said first second and third optically nonlinear crystals in the sequence listed;
    said first optically nonlinear crystal arranged to convert a portion of said fundamental radiation to second-harmonic radiation;
    said second optically nonlinear crystal arranged to convert a portion of said second-harmonic radiation from said first optically nonlinear crystal into radiation having a converted frequency different from the frequency of said second-harmonic radiation; and
    wherein said third optically nonlinear crystal is arranged to convert at least a portion of a remaining portion of said second-harmonic radiation from said second optically nonlinear crystal back to fundamental radiation.

2. The laser of claim 1, wherein said converted-frequency radiation is third-harmonic radiation generated by mixing said portion of said second-harmonic radiation with a portion of said fundamental radiation.

3. The laser of claim 2, wherein said third-harmonic radiation is delivered from said resonator as output radiation.

4. The laser of claim 2, further including a fourth optically nonlinear crystal located in said ring resonator between said second and third optically nonlinear crystals, said fourth optically nonlinear crystal arranged to mix said third-harmonic radiation with said fundamental radiation thereby providing fourth-harmonic radiation.

5. The laser of claim 4, wherein said fourth-harmonic radiation is delivered from said ring resonator as output radiation.

6. The laser of claim 2, wherein said back conversion of second-harmonic radiation is optimized when there is a particular phase relationship between said fundamental and second-harmonic radiations on entering said third optically nonlinear crystal, and wherein the laser further includes an optical arrangement for causing an optical path difference between said fundamental and third-harmonic radiations before the radiations enter the crystal, thereby causing the phase relationship between said fundamental and second-harmonic radiations entering said third optically nonlinear crystal to vary periodically with frequency of said fundamental radiation, said periodic variation being such that there is at least one possible fundamental radiation frequency of said laser resonator for which said particular phase relationship exists at said third nonlinear crystal.

7. The laser of claim 6, wherein said resonator has a mode-spacing, said gain-element has a gain bandwidth, and said periodically varying phase relationship has a period less than said gain bandwidth and greater than said mode spacing.

8. The laser of claim 7, wherein said fundamental radiation has a frequency of about 217 THz, said mode spacing is about 300 MHz, said gain bandwidth is about 30 GHz and said phase relationship variation period is about 3 GHz.

9. The laser of claim 6, wherein said path difference between said fundamental and second-harmonic radiations is adjustable.

10. The laser of claim 6, wherein second optically nonlinear crystal is located between first and second pairs of pairs of spaced apart mirrors, each pair of mirrors including a first mirror highly reflective for said fundamental radiation and highly transmissive for said second-harmonic radiation, and wherein fundamental and second-harmonic radiation generated by said first optically nonlinear crystal follows a first common path to said first one of said first pair of mirrors whereat fundamental radiation is reflected along a first independent path and said second-harmonic radiation is transmitted to said second one of said first pair of mirrors whereat said second-harmonic radiation is reflected along a second independent path through said first one of said first pair of mirrors, said first and second ones of said first pair of mirrors being spaced and aligned such that said first and second independent paths converge at an entrance face of said second optically nonlinear crystal, and wherein said second optically nonlinear crystal is configured and aligned with respect to said first and second independent paths such that said fundamental and second-harmonic radiations travel along a second common path in said second optically nonlinear crystal and leave said second optically nonlinear crystal at an exit face thereof along respectively third and fourth independent paths diverging one from the other.

11. The laser of claim 10, wherein said fundamental and second-harmonic radiations on said third and fourth independent paths are respectively reflected by and transmitted by said first mirror of said second pair of mirrors, said transmitted second-harmonic radiation being reflected by said second mirror of said second pair of mirrors and re-transmitted through said second mirror, said first and second ones of said second pair of mirrors being spaced and aligned such that said reflected fundamental radiation and said transmitted, reflected and re-transmitted second-harmonic radiation follow a third common path to said third optically nonlinear crystal.

12. The laser of claim 11, wherein spacing between mirrors of one of said first and second pairs of mirrors is variable for adjusting said phase relationship of said fundamental and first harmonic radiations at said third optically nonlinear crystal.

13. The laser claim 1, wherein said gain-element is a Nd:YVO4 gain-element and said fundamental radiation has a wavelength of 1064 nanometers.

14. The laser of claim 1, wherein said gain-element is a semiconductor multilayer gain-structure and said fundamental radiation has a wavelength of 976 nanometers.

15. The laser of claim 1, wherein said first and third optically nonlinear crystals are LBO crystals and said second optically nonlinear crystal is a BBO crystal.

16. The laser of claim 1, wherein said first and third optically nonlinear crystals are LBO crystals and said second optically nonlinear crystal is a CLBO crystal.

17. The laser of claim 1, wherein said resonator is formed from a plurality of optical components and said optical components are spaced-apart and configured such that circulating fundamental radiation is focused to a reduced diameter at first, second and third beam waist positions, and wherein said first, second, and third, optically nonlinear crystals are located in said beam at respectively said first, second, and third waist positions.

18. The laser of claim 1, wherein said converted-frequency radiation has a non-integer relationship with said second harmonic radiation and generated by an optical parametric interaction process in said second optically nonlinear crystal.

19. The laser of claim 18, wherein said second optically nonlinear crystal is collocated in a second resonator arranged such that said converted-frequency radiation circulates therein.

20. The laser of claim 19, wherein said second resonator is a standing-wave resonator.

21. The laser of claim 20, wherein said traveling-wave resonator and said second resonator are partially coaxial and said second optically nonlinear crystal is located in said coaxial part of said resonators.

22. The laser of claim 19, wherein said converted-frequency radiation is delivered from said second resonator as output radiation.

23. A laser, comprising:
a traveling wave ring laser resonator;
first, second, and third optically nonlinear crystals located in said ring resonator;
said ring resonator including at least one gain-element generating fundamental radiation in said ring resonator, said fundamental radiation circulating through said first second and third optically nonlinear crystals in the sequence listed;
said first optically nonlinear crystal arranged to convert a portion of said fundamental radiation to second-harmonic radiation;
said second optically nonlinear crystal arranged to convert portions of said fundamental and second-harmonic radiations from said first optically nonlinear crystal into third-harmonic radiation; and
wherein said third optically nonlinear crystal is arranged to convert at least a portion of a remaining portion of said second-harmonic radiation from said second optically nonlinear crystal back to fundamental radiation; and
wherein said laser resonator is formed by a plurality of optical components into first and second superposed planes, with said optically nonlinear crystals located in said resonator in said first plane thereof and said at least one gain-element and any other gain-elements being located in said second plane thereof.

24. The laser of claim 23, wherein said resonator includes two gain-elements said plurality of optical components includes first and second prisms each thereof including two spaced-apart total internal reflecting surfaces, and first, second, third, and fourth mirrors, wherein said first and fourth mirrors are in said second plane, said second and third mirrors are in said first plane, said first and second reflecting surfaces of said first prism are in said second and first planes respectively, and said first and second reflecting surfaces of said second prism are in said first and second planes respectively, and wherein fundamental radiation generated by said gain elements is reflected from said first mirror to said first prism, sequentially reflected from said first and second surfaces of said first prism, transmitted through said first optically nonlinear crystal to said second mirror, reflected by said second mirror through said second optically nonlinear crystal to said third mirror, reflected by said third mirror to said second prism, sequentially reflected from said first and second surfaces of said second prism, and reflected by said fourth mirror through said gain-elements.

25. The laser of claim 24, further including a fifth mirror spaced apart from said second mirror and a sixth mirror spaced apart from said third mirror, said second and third mirrors being highly reflective for said fundamental radiation and highly transmissive for said second-harmonic radiation, and wherein fundamental and second-harmonic radiation generated by said first optically nonlinear crystal follows a first common path to said second mirror whereat fundamental radiation is reflected along a first independent path and said second-harmonic radiation is transmitted to said fifth mirror whereat said second-harmonic radiation is reflected along a second independent path through said second mirror, said second and fifth mirrors being spaced and aligned such that said first and second independent paths converge at an entrance face of said second optically nonlinear crystal, and wherein said second optically nonlinear crystal is configured and aligned with respect to said first and second independent paths such that said fundamental and second-harmonic radiations travel along a second common path in said second optically nonlinear crystal and leave said second optically nonlinear crystal at an exit face thereof along respectively third and fourth independent paths diverging one from the other.

26. The laser of claim 25, wherein said fundamental and second-harmonic radiations on said third and fourth independent paths are respectively reflected by and transmitted by said third mirror, said transmitted second-harmonic radiation being reflected by said sixth mirror and re-transmitted through said third mirror, said third and sixth mirrors being spaced and aligned such that said reflected fundamental radiation and said transmitted, reflected and re-transmitted second-harmonic radiation follow a third common path to said third optically nonlinear crystal.

27. The laser of claim 26, wherein spacing between said third and sixth mirrors is variable for adjusting said phase relationship of said fundamental and first harmonic radiations at said third optically nonlinear crystal.

28. The laser of claim 26, wherein said back conversion of second-harmonic radiation is optimized when there is a particular phase relationship between said fundamental and second-harmonic radiations on entering said third optically nonlinear crystal, and wherein the spacing between said second and fifth and said third and sixth mirrors creates an optical path difference between said fundamental and third-harmonic radiations before the radiations enter said third optically nonlinear crystal thereby causing the phase relationship between said fundamental and second-harmonic radiations entering said third optically nonlinear crystal to vary periodically with frequency of said fundamental radiation, said periodic variation being such that there is at least one possible fundamental radiation frequency of said laser resonator for which said particular phase relationship exists at said third nonlinear crystal.

29. A method of generating third-harmonic radiation in a ring laser resonator, the ring laser resonator including one or more gain-elements generating fundamental laser radiation therein, the method comprising the steps of:
 (a) providing first, second, and third optically nonlinear crystal located in the resonator;
 (b) configuring the laser resonator such the laser radiation circulates in one direction only therein through said first, second, and third optically nonlinear crystals in the sequence listed;
 (c) converting a portion of the fundamental radiation to second-harmonic radiation in said first optically nonlinear crystal;
 (d) converting a portion of unconverted fundamental radiation and a portion of the second-harmonic radiation from step (c) to third-harmonic radiation in the second optically nonlinear crystal; and
 (e) converting unconverted second-harmonic radiation from step (d) to fundamental radiation.

30. The method of claim 29, wherein said conversion of second-harmonic radiation in step (e) is optimized when there is a particular phase relationship between said fundamental and second-harmonic radiations on entering said third optically nonlinear crystal, and wherein the method further includes the step of (f) creating an optical path difference between said fundamental and third-harmonic radiations before the radiations enter said third optically nonlinear crystal, thereby causing the phase relationship between said fundamental and second-harmonic radiations entering said third optically nonlinear crystal to vary periodically with frequency of said fundamental radiation, said path difference being sufficiently great that said periodic variation is such that there is at least one possible fundamental radiation frequency of said laser resonator for which said particular phase relationship exists at said third nonlinear crystal.

31. A method of generating third harmonic radiation in a traveling wave ring laser resonator having a gain medium therein generating fundamental radiation comprising the steps of:
 converting the frequency of the fundamental radiation into a second harmonic thereof;
 converting a combination of the fundamental and second harmonic radiation into a third harmonic thereof; and
 down converting a portion of the unconverted second harmonic radiation into fundamental radiation, said down converted fundamental radiation being recirculated and used to create additional second and third harmonic radiation.

* * * * *